United States Patent
Hasegawa et al.

(10) Patent No.: US 7,344,031 B2
(45) Date of Patent: Mar. 18, 2008

(54) SUBSTRATE STORAGE CONTAINER

(75) Inventors: Akihiro Hasegawa, Niigata (JP); Hiroshi Mimura, Niigata (JP)

(73) Assignee: Shin-Etsu Polymer Co., Ltd., Tokyo (JP)

( * ) Notice: Subject to any disclaimer, the term of this patent is extended or adjusted under 35 U.S.C. 154(b) by 297 days.

(21) Appl. No.: 11/148,147

(22) Filed: Jun. 8, 2005

(65) Prior Publication Data
US 2005/0274645 A1 Dec. 15, 2005

(30) Foreign Application Priority Data
Jun. 11, 2004 (JP) ............................. 2004-174035

(51) Int. Cl.
*B65D 85/48* (2006.01)
(52) U.S. Cl. ...................... 206/710; 206/454
(58) Field of Classification Search ........ 206/710–711, 206/454; 211/41.18
See application file for complete search history.

(56) References Cited

U.S. PATENT DOCUMENTS

| | | | | |
|---|---|---|---|---|
| 5,207,324 A * | 5/1993 | Kos | ............................ | 206/711 |
| 5,253,755 A * | 10/1993 | Maenke | ........................ | 206/454 |
| 5,273,159 A * | 12/1993 | Gregerson | ................... | 206/711 |
| 5,476,176 A * | 12/1995 | Gregerson et al. | ........... | 206/711 |
| 5,706,946 A * | 1/1998 | Kakizaki et al. | ............. | 206/454 |
| 6,082,540 A | 7/2000 | Krampotich et al. | | |
| 6,105,782 A | 8/2000 | Fujimori et al. | | |
| 6,267,245 B1 | 7/2001 | Bores et al. | | |
| 6,273,261 B1 * | 8/2001 | Hosoi | ......................... | 206/711 |
| 6,446,806 B1 * | 9/2002 | Ohori et al. | ................. | 206/454 |
| 6,591,987 B2 | 7/2003 | Wu et al. | | |
| 6,644,477 B2 | 11/2003 | Bores et al. | | |
| 6,951,284 B2 * | 10/2005 | Cheesman et al. | .......... | 206/711 |
| 7,017,749 B2 * | 3/2006 | Yajima et al. | .............. | 206/711 |
| 7,073,999 B2 * | 7/2006 | Oyama | ....................... | 206/454 |

FOREIGN PATENT DOCUMENTS

| | | |
|---|---|---|
| JP | 2003-174081 | 6/2003 |
| WO | WO 02/097879 | 12/2002 |
| WO | WO 03/042071 | 5/2003 |

OTHER PUBLICATIONS

International Search Report for PCT/JP02/05274; Aug. 26, 2002.
Patent Abstracts of Japan for Publication No. 2003-174081; Jun. 20, 2003.

* cited by examiner

*Primary Examiner*—Bryon P Gehman
(74) *Attorney, Agent, or Firm*—Osha Liang LLP

(57) ABSTRACT

A substrate storage container comprises: a container casing having an aperture through which a plurality of substrates are placed in or taken out; a cover adapted to fit into the aperture of the container casing; a sealing gasket capable of elastic deformation provided between the container casing and the cover; and a retainer, mounted on the cover, capable of retaining the periphery of the substrates. The retainer has: a supporting body mounted on the inside face of the cover; a plurality of elastic pieces provided in elastically deformable fashion on the supporting body; and a block provided on each of the elastic pieces, the block retaining the periphery of one of the substrates. A relation $10.8 \times w < y < 34.3 \times w$ is satisfied when a substrate retaining force of each of the elastic pieces is y [unit: N] and a weight per the substrate is w [unit: kg].

14 Claims, 18 Drawing Sheets

SUBSTRATE STORAGE CONTAINER

BACKGROUND OF THE INVENTION

1. Field of the Invention

The present invention relates to a substrate storage container that is employed for storing, accommodating, transporting and feeding substrates such as silicon wafers or glass masks.

2. Related Background Art

Silicon wafers are formed of various sizes in semiconductor factories. More IC chips can be manufactured from a silicon wafer of large diameter than from a silicon wafer of small diameter. For example, whereas only 44 IC chips can be manufactured from a silicon wafer of diameter 200 mm (8 inches), some 112 IC chips can be manufactured from a silicon wafer of diameter 300 mm (12 inches).

In view of the advantage of being able to considerably increase the number of IC chips that can be acquired, silicon wafers of large diameter are being increasingly used. Accompanying this, there is a shift from the conventionally employed open-top box-type substrate storage container to an open-front box-type substrate storage container, in respect of which automation is a precondition.

Although not shown, a substrate storage container for storing silicon wafers of large diameter comprises an open-front box-type container casing, a cover, a front retainer, a sealing gasket and a latch mechanism. The container casing stores a plurality of silicon wafers in a stack. The cover is detachably fitted onto the front aperture of the container casing. The front retainer is mounted on the cover and retains the front periphery of the plurality of silicon wafers. The sealing gasket is interposed between the container casing and the cover. The latch mechanism is incorporated in the cover and fixes the cover that is fitted onto the front aperture of the container casing. In this substrate storage container, insertion/removal of silicon wafers and/or opening/closing of the cover are performed automatically by a special-purpose device (robot or cover opening/closing device).

Such substrate storage containers can be classified into the FOUP type (standardized in accordance with SEMI standard E 47.1) that are employed for substrate feeding in a processing step and FOSB type containers (standardized in accordance with SEMI standard M31) that are employed for shipping or transportation of silicon wafers.

However, there was the problem that, since the mode of opening/closing the cover was different as between the FOUP type and FOSB type, the cover opening/closing device standardized for the FOUP type could not be employed for opening/closing the cover of the FOSB type without modification.

Also in the case of the FOSB type there was a risk of the silicon wafers being damaged since the silicon wafers might be subjected to greater than anticipated shock during transportation (for example changes in air pressure during transportation by air).

Also, in the case of silicon wafers of large diameter, the front and back surfaces of the silicon wafer are both formed as specular surfaces and there are strict standards relating to particles; furthermore, when the silicon wafers are inserted or removed by a special-purpose robot, generation of particles and/or mispositioning must be suppressed to the utmost. Furthermore, the cover may sometimes be subjected to repeated opening/closing operations and in this case there was a risk of mispositioning of the sealing gasket or excessive deformation.

SUMMARY OF THE INVENTION

An object of the present invention is to provide a substrate storage container capable of employing a standardized cover opening/closing device and whereby damage to the substrates can be suppressed even when for example subjected to more than anticipated shock. A further object is to provide a substrate storage container wherein generation of particles and/or mispositioning of the substrate can be prevented as far as possible and wherein mispositioning of the sealing gasket or excessive deformation thereof can be avoided.

An substrate storage container according to the present invention comprises: a container casing having an aperture through which a plurality of substrates are placed in or taken out; a cover adapted to fit into the aperture of the container casing; a sealing gasket capable of elastic deformation provided between the container casing and the cover; and a retainer, mounted on the cover, capable of retaining the periphery of the substrates. The retainer has: a supporting body mounted on the inside face of the cover; a plurality of elastic pieces provided in elastically deformable fashion on the supporting body; and a block provided on each of the elastic pieces, the block retaining the periphery of one of the substrates. A relation $10.8 \times w < y < 34.3 \times w$ is satisfied when a substrate retaining force of each of the elastic pieces is y [unit: N] and a weight per the substrate is w [unit: kg].

The substrates are preferably silicon wafers of diameter 300 mm. The container casing is preferably an open-front box-type casing. Preferably the substrate retaining force of each of the elastic pieces when the maximum number of the silicon wafers is stored in the container casing is in a range of 1.3 to 4.5 N.

Preferably the substrates are silicon wafers of diameter 300 mm. The container casing is preferably an open-front box-type casing. A pressing force of the cover when the maximum number of the silicon wafers are stored in the container casing and the aperture of the container casing is closed by the cover is in a range of 30 to 112.5 N.

Preferably the cover pressing force is in a range of 40 to 80 N.

The block preferably comprises a pair of guided blocks including a guide groove for guiding a substrate and a position locating groove that positionally locates the substrate provided at the bottom of the guide groove; and a guide block including a guide groove for guiding the substrate provided between the guided blocks.

Preferably the guide block projects further towards the container casing than the guided blocks.

Preferably a width of the aperture of the guide groove of the guide block is larger than a width of the aperture of the guide groove of the guided block.

Preferably a center angle made by the pair of opposite inside faces constituting the guide groove of the guide block is 45° to 60°.

Preferably a center angle made by the pair of opposite inside faces constituting the guide groove of the guided block is 45° to 60° and a center angle made by the pair of opposite inside faces constituting the position locating groove is 10° to 40°.

Also a substrate storage container according to the present invention comprises: a container casing having an aperture through which a plurality of substrates are placed in or taken out; a cover adapted to fit into the aperture of the container casing; a sealing gasket capable of elastic deformation provided between the container casing and the cover; and a retainer, mounted on the cover, capable of retaining the periphery of the substrates. The container casing is an open-front box-type casing respectively provided with supporting walls on both sides of the interior thereof. A plurality of teeth that support the substrates are provided arranged in a row in the vertical direction on the inside face of the supporting walls. Each of the teeth comprises: a flat plate running along the lateral periphery of the substrate; a front medium thickness region formed on the inside at the front of the flat plate; a front increased thickness region of thickness greater than that of the front medium thickness region, formed at the front outside of the flat plate and positioned on the outside of the front medium thickness region; a rear medium thickness region formed at the rear of the flat plate; and a step provided between the front medium thickness region and the front increased thickness region. Each of the teeth can support one of the substrates substantially horizontally in the front medium thickness region and the rear medium thickness region.

Preferably the sealing gasket comprises: an endless body that fits into a recess of the cover periphery; a bent piece projecting in an obliquely outwards direction from the endless body and capable of bending contacting the aperture of the container casing; and a projection that is formed on the endless body and that contacts the recess of the cover periphery.

Preferably each of the teeth comprise a reduced thickness region of thickness smaller than that of the front medium thickness region and the rear medium thickness region, provided on the flat plate between the front medium thickness region and the rear medium thickness region.

Preferably the retainer comprises a support body mounted on the inside face of the cover, a plurality of elastic pieces provided in elastically deformable fashion on the support body, and a block provided on each of the elastic pieces, the block retaining the periphery of one of the substrates. A relation $10.8 \times w < y < 34.3 \times w$ is satisfied when a substrate retaining force of each of the elastic pieces is y [unit: N] and a weight per the substrate is w [unit: kg].

The term "substrate" includes at least silicon wafers of 300 mm diameter, semiconductor wafers of large diameter, glass wafers, large glass masks and liquid crystal glass members. There are no particular restrictions regarding the container casing, which may be of the FOUP type or FOSB type, transparent, semi-transparent or opaque. A see-through window may be suitably provided in the rear face wall, side wall or top wall of this container casing.

For the cover a single or a plurality of plates may be employed and the cover may be transparent, semi-transparent or opaque. This cover may be provided with a latch mechanism. The latch mechanism may comprise for example: a rotary body supported on the cover and that it is rotated by operation from outside the cover; a pair of longitudinally slidable latch arms operably connected to the rotary body; and an engagement roller rotatably supported in the vicinity of an aperture at the periphery of the cover, rotatably linked with the tip of the latch arms and that can project from the aperture of the cover or retract in response to the extension/retraction operation of the latch arms.

Also, the latch mechanism may comprise: a rotary body supported on the cover and that is rotated by operation from outside the cover; a plurality of shafts supported in slidable fashion by means of bearings on the cover and directly or indirectly connected in rotatable manner with the rotary body, being capable of extension/retraction movement in the outwards direction from the interior direction of the cover in response to rotation of this rotary body; and rollers rotatably supported on the shafts and that can project from an aperture at the periphery of the cover or retract in response to the extension/retraction operation of the shafts. If the rotary body and shafts are indirectly connected, the rotary body and shafts may be linked for example by a crank or the like.

Also, the latch mechanism may comprise: a gearwheel that is supported on the cover in a condition such as to suppress generation of dust and that rotates by operation from outside the cover; a pair of latch arms slidably supported on the cover, connected with the gearwheel through another gearwheel and that perform extension/retraction movement in the outwards direction from the interior direction of the cover in response to rotation of the gearwheel; and engagement claws formed at the tips of the latch arms and that can project from an aperture at the periphery of the cover or retract in response to the extension/retraction operation of the latch arms. The ends of the latch arms can then be rotatably supported in locations offset from the center of the other gearwheel.

The retainer need not necessarily be a front retainer that retains the front periphery of a substrate but could also be a rear retainer that retains the rear periphery of a substrate. The support body may be formed for example as a frame or U shape. Also, the elastic pieces may be formed for example in a shape combining a plurality of concave portions and convex portions, a shape combining a plurality of U-shaped elements or in linear shape and the number thereof may be increased or decreased. If there are a plurality of elastic pieces, each elastic piece may be formed with a single or a plurality of projections contacting another adjacent elastic piece, to prevent mutual interference or contact of the elastic pieces.

The blocks may be formed substantially V-shaped, substantially dish-shaped, substantially Y-shaped or substantially funnel-shaped in cross section. The case where the substrates are supported by the teeth may include both the case in which the substrates are supported by the teeth horizontally or may include the case in which the substrates are supported by the teeth with an inclination of the order of about 10°. Also, the front medium thickness region of the teeth may be formed for example as a convex portion or a bar or the like.

The bent piece of the sealing gasket may be project linearly in an outwardly oblique direction or may project in curved fashion. This curved element may be tapered or may not be tapered. The projection may be formed of a rectangular, circular, elliptical, triangular, polygonal or trapezoidal cross-section and there may be one or more thereof. These projections may be formed in endless fashion in the longitudinal direction of an endless body or may be formed in a row in substantially a dotted line configuration.

Since, according to the present invention, the retaining force of the elastic pieces of the retainer is set in a suitable range, even if for example the substrates are subjected to strong shock or force during movement of the substrate storage container, the risk of substrate damage can be excluded. Also, when the cover of the FOSB type is to be opened or closed, a cover opening/closing device standardized for the FOUP type can be employed without modification.

Also, thanks to the provision of a step that contacts the substrate between the front medium thickness region and front increased thickness region of the teeth, the position of the substrate in the container casing is controlled and mispositioning can be prevented.

Also, since there is no possibility of tilting of the bent piece of the sealing gasket in the outside direction of the substrate storage container or of deformation of the bent piece in either the inner or outer direction of the substrate storage container, unevenness of sealing can be suppressed. Also, since the projections of the endless body are pressed strongly into contact with the concave sections of the cover, the sealing gasket cannot easily come loose from the cover.

The present invention will become even better understood by reference to the following detailed description and appended drawings. These are given merely by way of example and are not to be considered as restricting the present invention.

DESCRIPTION OF THE PREFFERRED EMBODIMENTS

Figure 1:
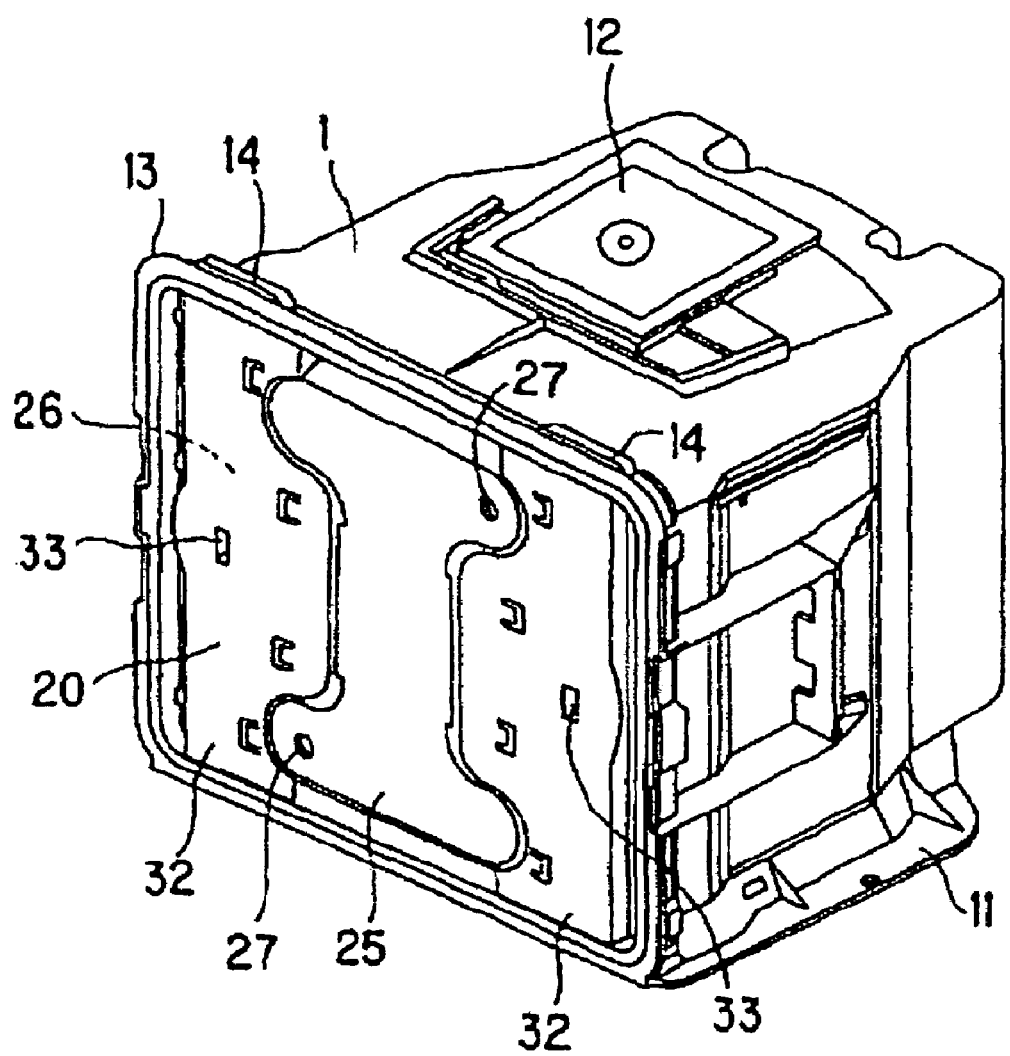
FIG. 1 is a perspective view showing a substrate storage container according to an embodiment of the present invention.

An embodiment of the present invention is described in detail below with reference to the appended drawings. Identical elements in the description of the drawings are given the same reference symbols and repeated description is dispensed with.

As shown in FIG. 1 to FIG. 14, a substrate storage container according to this embodiment comprises a container casing 1, a cover 20, a front retainer 40, a sealing gasket 60 and latch mechanisms 70. The container casing 1 stores a plurality (for example 25) of silicon wafers W. The cover 20 is detachably fitted onto a front face aperture of the container casing 1. The front retainer 40 is mounted on the cover 20 and retains the front periphery of the plurality of silicon wafers W. The sealing gasket 60 is interposed between the container casing 1 and the cover 20. The latch mechanisms 70 are incorporated in the cover 20 and lock and fix the cover 20 that is fitted onto the front aperture of the container casing 1. The front retainer 40 has a plurality of elastic pieces 44 for retaining silicon wafers W. In this substrate storage container, if the substrate retaining force per elastic piece 44 is defined as y [N] and the weight per silicon wafer W is defined as w [kg], the relationship: $10.8 \times w < y < 34.3 \times w$ is satisfied. In this relationship expression, "x" indicates a product.

Figure 2:
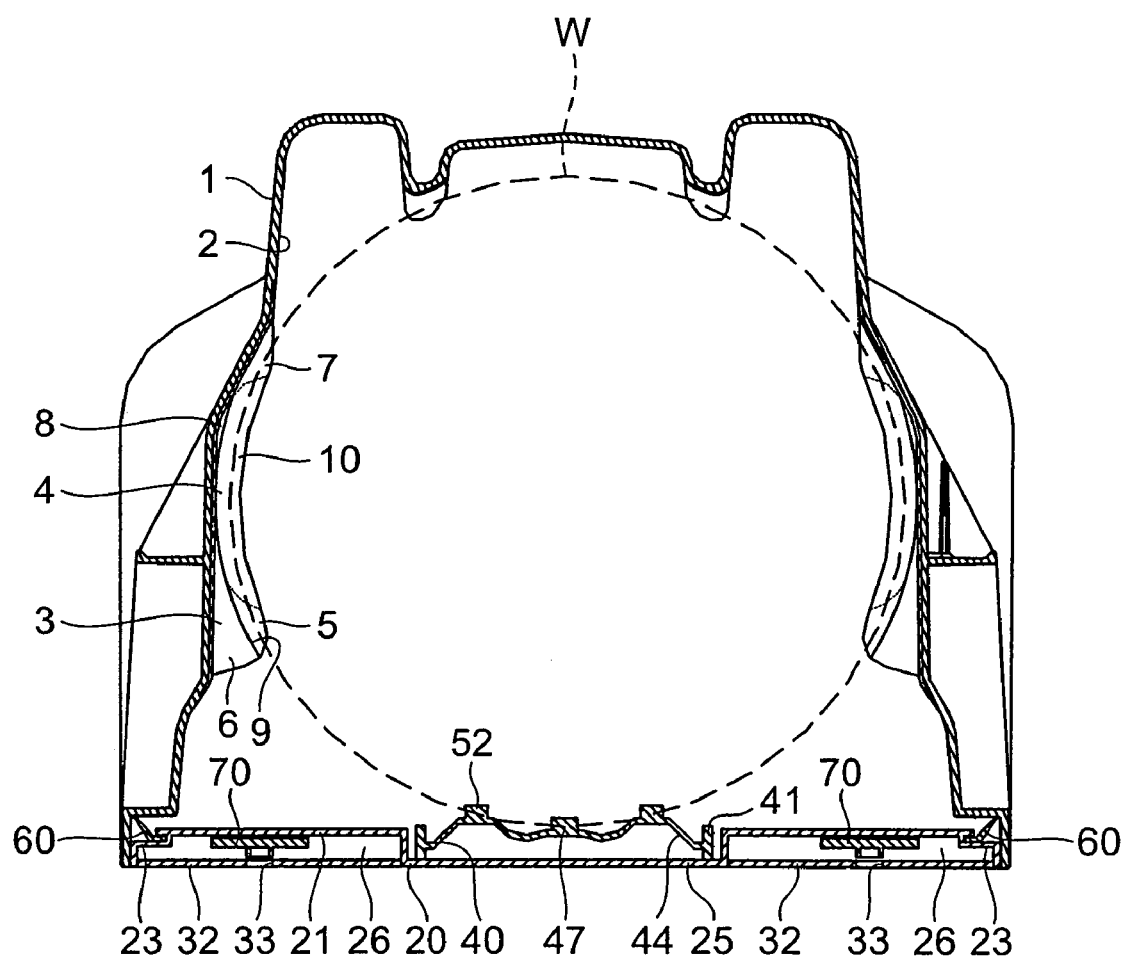
FIG. 2 is a transverse cross-sectional view showing a substrate storage container.

As shown in FIG. 2, the silicon wafers W are round wafers of diameter 300 mm whose front face and rear face are respectively formed as specular faces. These silicon wafers W are inserted and removed in a condition with their left and right lateral peripheries handled by a special-purpose robot. Substantially semi-circular notches, not shown, for purposes of facilitating identification of the direction of crystallization and/or for facilitating stacking are cut in the peripheries of these silicon wafers W.

Figure 3:
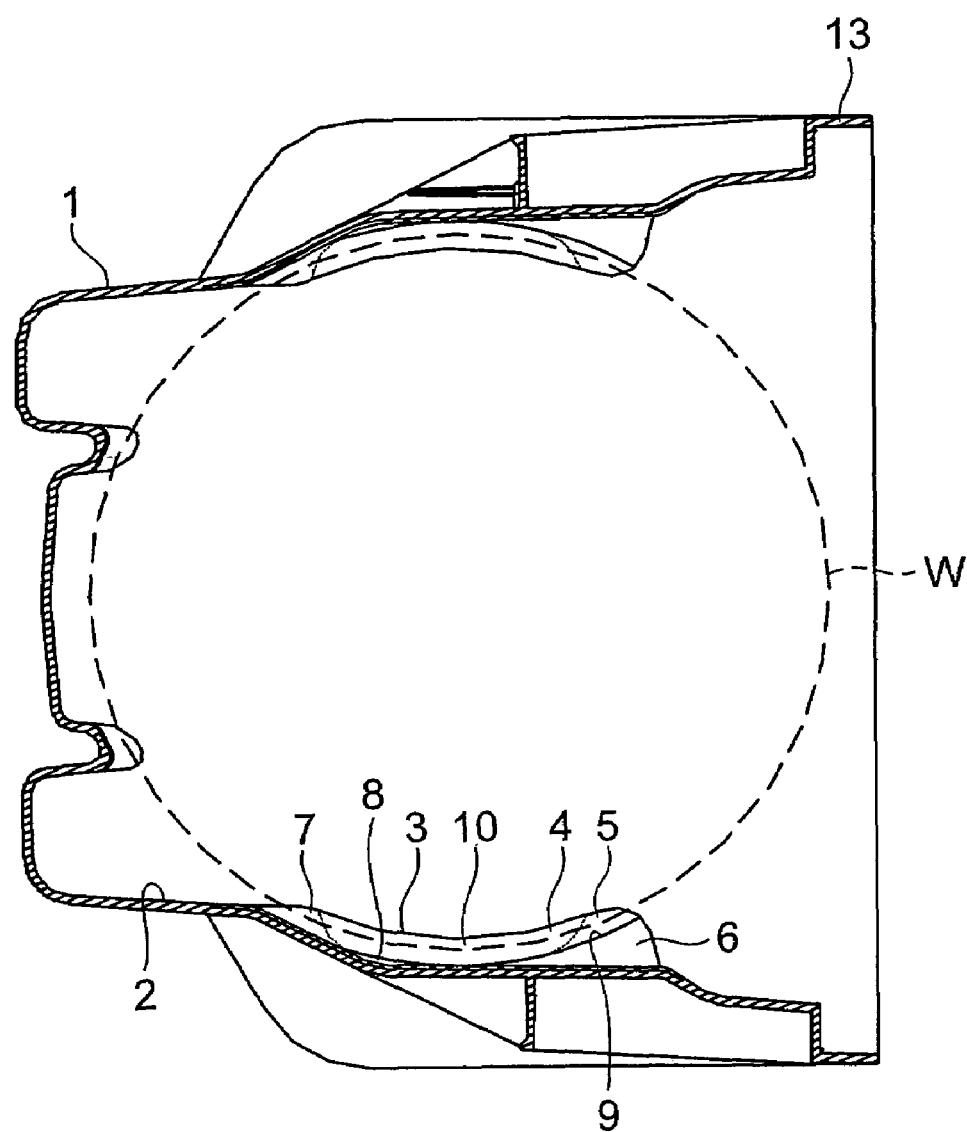
FIG. 3 is a transverse cross-sectional view showing a container casing, supporting wall and teeth.

As shown in FIG. 1 to FIG. 3, the container casing 1 is of the open-front box-type and is formed of resin. The container casing 1 comprises a top wall, bottom wall, a pair of side walls, a rear face wall and a front aperture. The rear sections of the pair of side walls are partially inclined inwards. A plurality of silicon wafers W are stacked in the vertical direction and stored arranged horizontally in this container casing 1.

Figure 4:
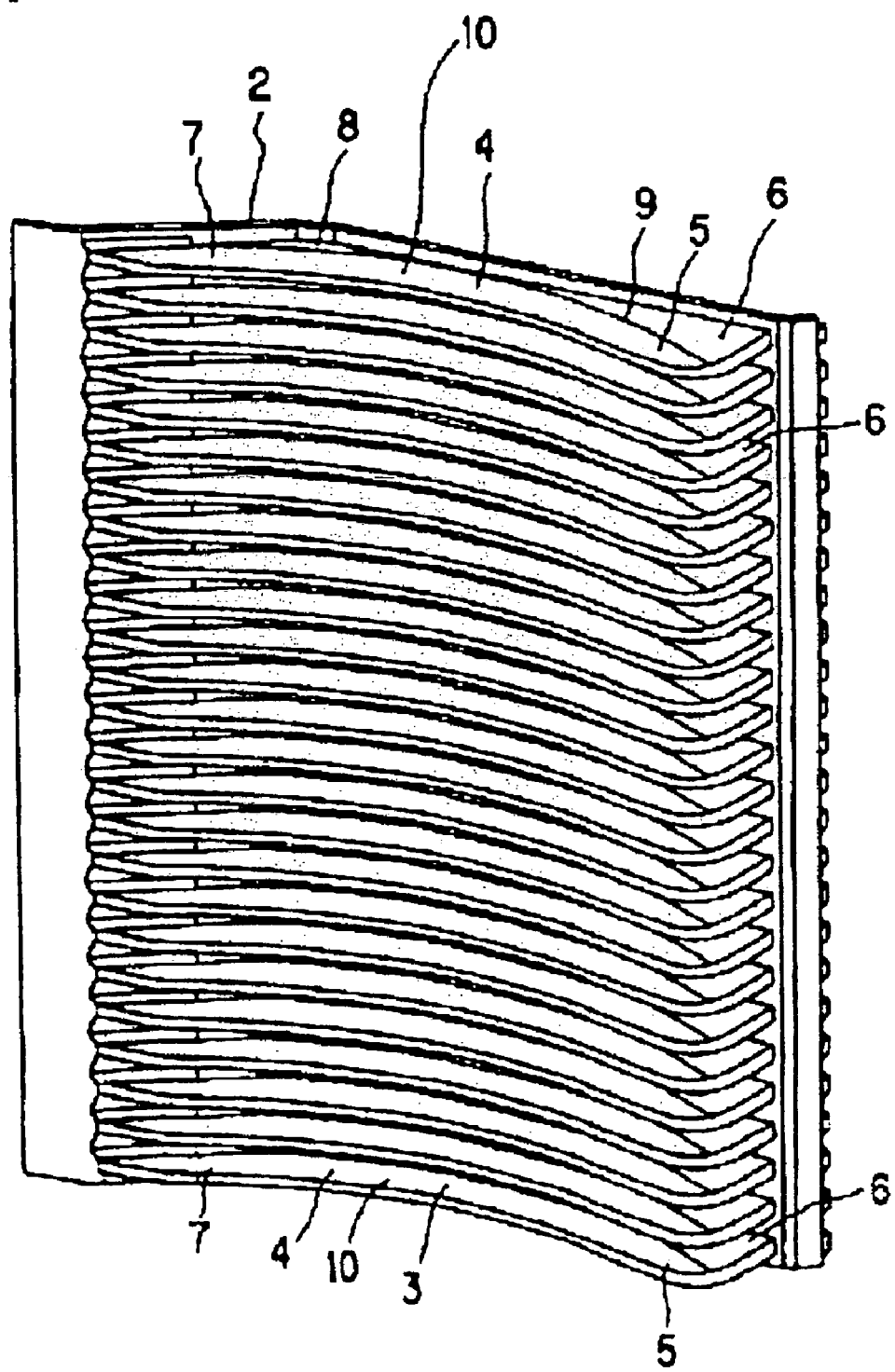
FIG. 4 is a perspective view showing a supporting wall and teeth.
Figure 5:
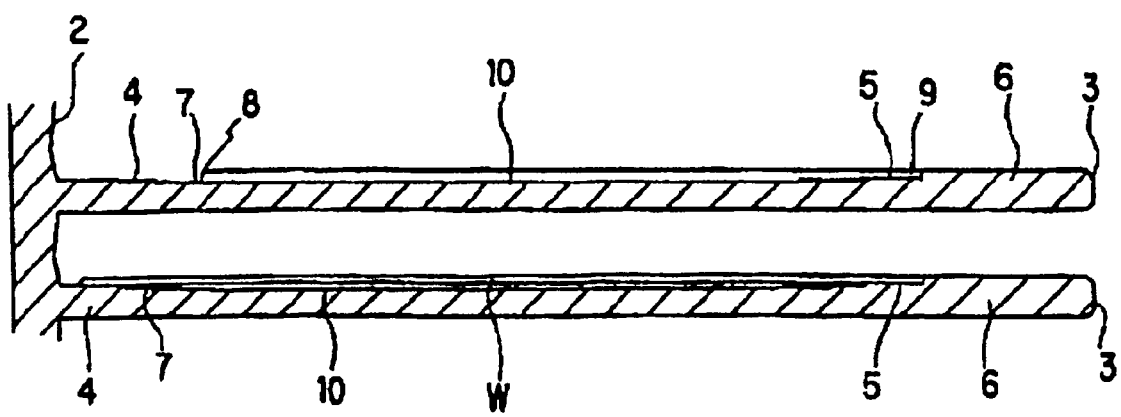
FIG. 5 is a cross-sectional view showing teeth and a silicon wafer.
Figure 6:
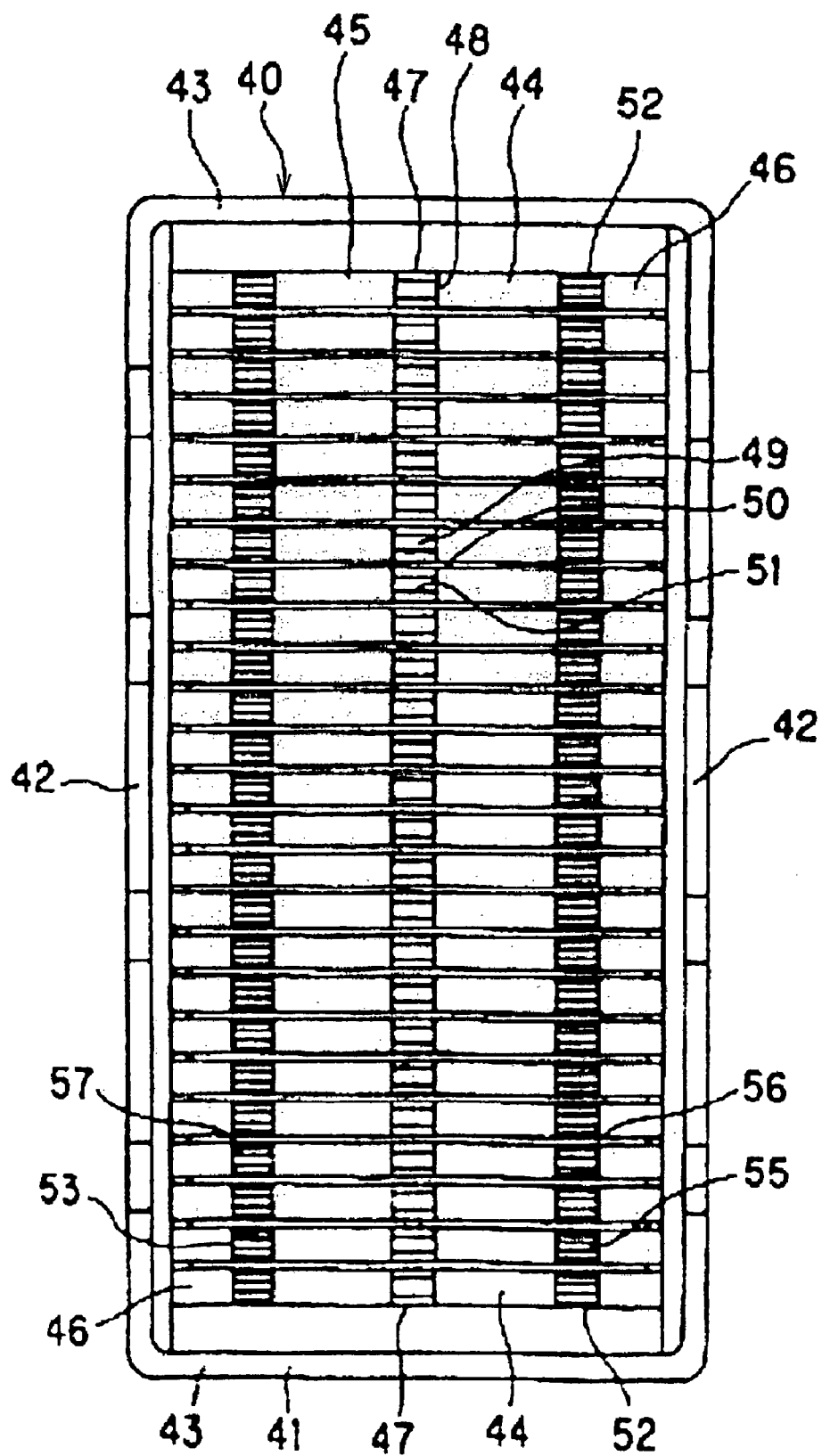
FIG. 6 is a front view showing a front retainer.
Figure 7:
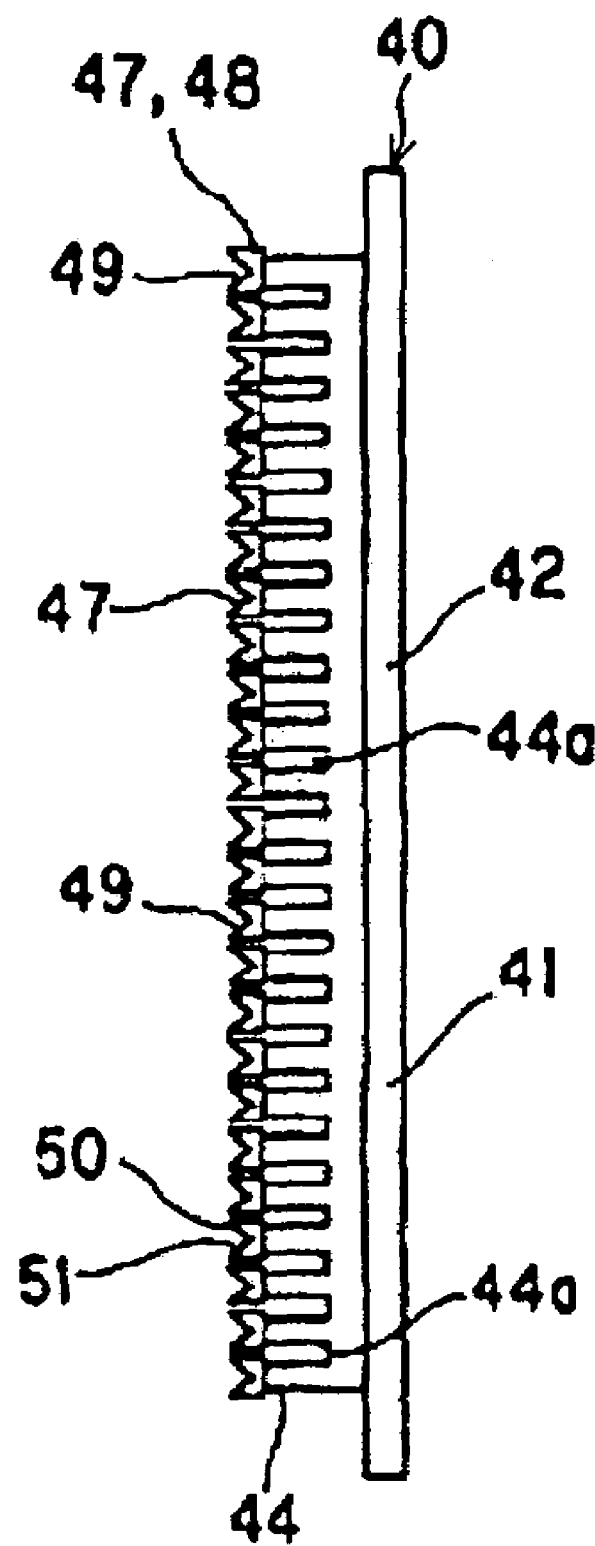
FIG. 7 is a side view showing a front retainer.
Figure 8:
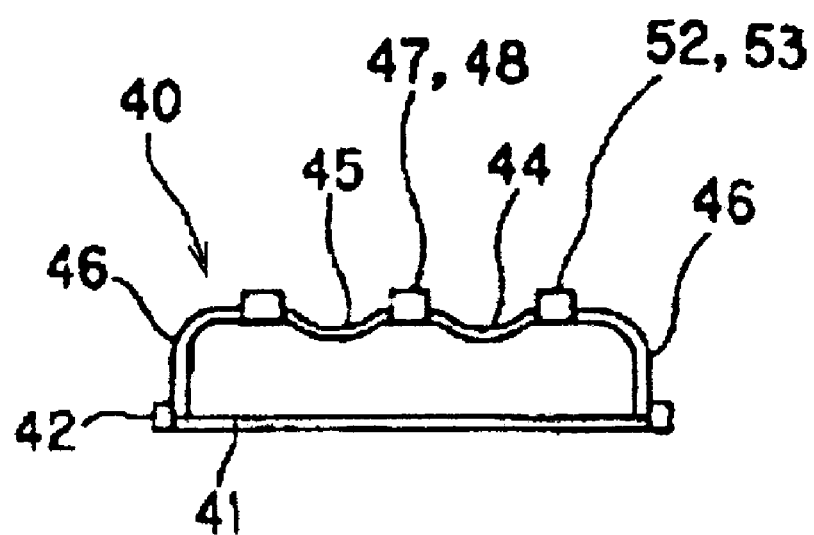
FIG. 8 is a plan view showing a front retainer.

As shown in FIG. 3 to FIG. 5, supporting walls 2 are respectively integrally provided on the inside of the pair of side walls. The supporting walls 2 may be respectively detachably provided on the inside of the pair of side walls. Substantially semi-circular, in plan view, arcuate teeth 3 are respectively integrally provided with a prescribed pitch (for example 10 mm) in the vertical direction in the faces of the pair of supporting walls 2 opposite to each other. These pairs of left and right teeth 3 support the silicon wafers W in substantially horizontal fashion.

As shown in FIG. 3 to FIG. 5, the teeth 3 comprise: a flat plate 4 formed in planar substantially arcuate shape running along the lateral periphery of a substrate; a front medium thickness region 5 formed on the front inside where this flat plate 4 is formed in bent fashion; a flat front increased thickness region 6 formed integrally with the front outside of the flat plate 4 and positioned on the outside of the front medium thickness region 5, in other words, towards the supporting wall 2; a rear medium thickness region 7 integrally formed at the rear of the flat plate 4; and a flat rear increased thickness region 8 positioned in front of the rear medium thickness region 7 integrally formed on the rear section of the flat plate 4 and positioned in an area slightly towards the supporting wall 2.

A slight perpendicular step 9 that contacts the lateral periphery of the silicon wafer W is formed between the front medium thickness region 5 and front increased thickness region 6. The front increased thickness region 6 is formed in substantially triangular shape in plan view such as to become narrower while gradually bending from the front face of the container casing 1 in the direction of the rear face thereof. The front increased thickness region 6 acts to restrain the silicon wafers W from flying out from the container casing 1 when the cover 20 is removed. Also, as shown in FIG. 5, a slightly concave reduced thickness region 10 is formed between the front medium thickness region 5 and the rear medium thickness region 7. This reduced thickness region 10 faces the lateral periphery of the silicon wafers W with a slight intervening gap.

These teeth 3 act so as to support the lateral periphery of the silicon wafers W at the flat planar front medium thickness region 5 and the rear medium thickness region 7 horizontally, maintaining high precision, so as to prevent insertion/removal by tilting of the silicon wafers W in the vertical direction using the fork of the robot from becoming difficult.

It should be noted that, during storing and supporting of the silicon wafers W, a silicon wafer W is not moved and supported while in contact with the surface of a pair of teeth 3: rather, with a view to preventing generation of particles, the silicon wafer W is first of all positionally located in the gap of a pair of teeth 3 in a condition held in the robot fork. The silicon wafer W is then supported on the pair of teeth 3 without coming into contact with the face of the supporting walls 2, by vertical lowering of the robot fork between the pair of teeth 3.

Although not shown in the drawings, position locating elements that are positionally located in a processing device in which the substrate storage container is mounted are respectively integrally formed on both sides at the front and in the middle of the rear section of the bottom wall of the container casing 1. A small bottom plate made of thin sheet is detachably installed from the rear at the rear section of the bottom wall of the container casing 1. The type of the substrate storage container and/or the number of silicon wafers W and other details can be ascertained by the processing device identifying one or more identifying elements fitted onto this bottom plate.

The position locating elements are not shown, but may be formed for example of substantially inverted M-shaped or substantially inverted Y-shaped cross section. The bottom plate may be for example substantially channel-shaped in plan view, substantially Y-shaped, or polygonal, and its size may be altered if required.

As shown in FIG. 1 and FIG. 2, guide rails 11 are formed extending in the forwards/rearwards direction on both sides of the bottom wall of the container casing 1. These guide rails 11 assist convenience of feeding of the substrate storage container. A substantially rectangular, in plan view, robotic flange 12 is integrally or detachably installed in the central section of the top wall of the container casing 1. Feeding of the substrate storage container during a processing step is achieved by this robotic flange 12 being held by an automatic feeder called an OHT (overhead transport).

The peripheral section that forms the front aperture of the container casing 1 is extended in the outwards direction to form a rim 13. Vertically within the rim 13, rectangular engagement holes 14 for locking the cover 20 are formed. Feed handles can be installed on both side walls of the container casing 1. The substrate storage container can be fed by gripping these feed handles.

The container casing 1, support walls 2, teeth 3, position locating elements, bottom plate, guide rails 11, robotic flange 12, and feed handles may be formed using for example polycarbonate, polyether imide, polyether ether ketone, or cyclic olefin resins. To these materials suitable additions may be made of conductivity enhancing agents such as carbon black, acetylene black, carbon fibers, carbon nanotubes, metal fibers, or conductive polymers such as polyacetylene, polypyrrole or polyaniline, cationic antistatic agents such as quaternary ammonium salts, or aliphatic amine salts, or reinforcing agents such as glass fiber, carbon fiber, or metal fiber.

Figure 13:
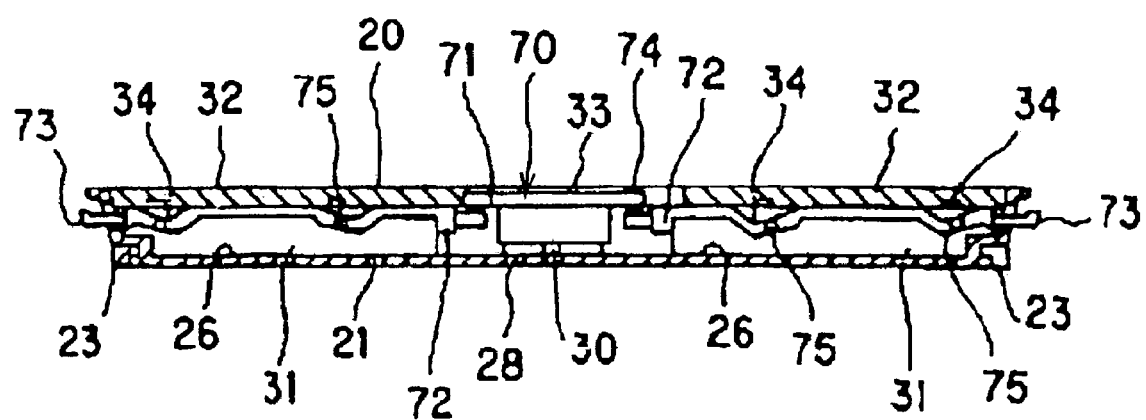
FIG. 13 is a cross-sectional view showing a cover and latch mechanism.
Figure 14:
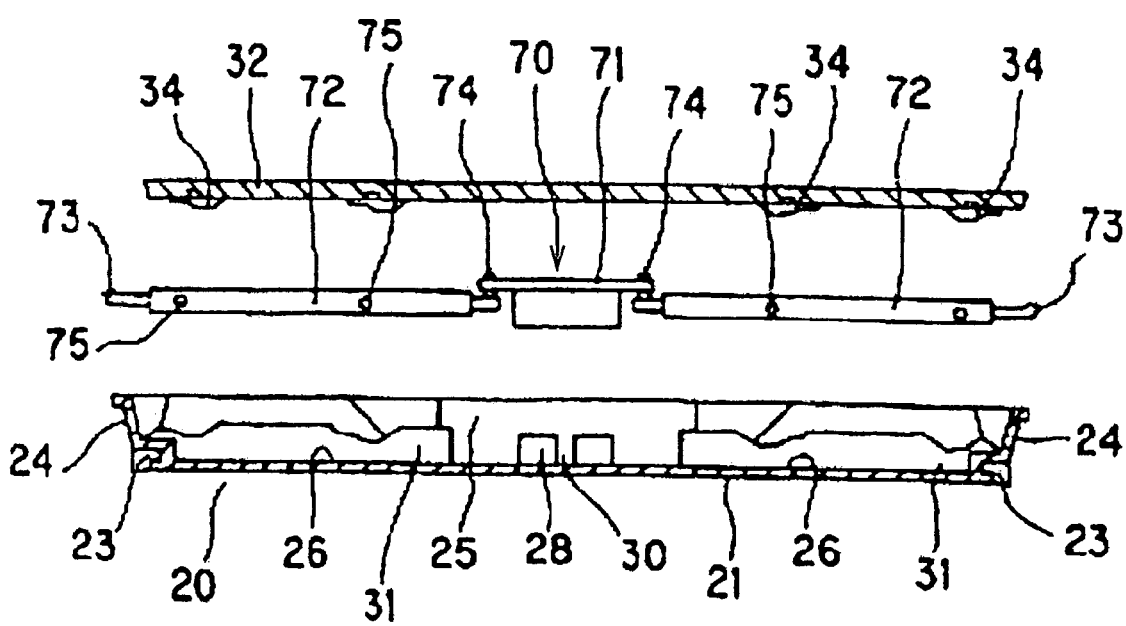
FIG. 14 is an exploded cross-sectional view showing a cover and latch mechanism.

As shown in FIG. 1, FIG. 13 and FIG. 14, the cover 20 comprises a fitting plate 21 that blocks the front aperture by being detachably fitted within the rim 13 of the container casing 1, and a pair of cover plates 32 that detachably cover a pair of latch mechanisms 70 that are set in position at the outer face of this fitting plate 21. The fitting plate 21 has a peripheral wall and is formed in a dish shape, recessed in the center. The fitting plate 21 is formed in a transversely elongate substantially rectangular shape in front view, rounded at the four corners. The peripheral wall may be formed substantially of L shape, substantially H shape or substantially Z-shaped cross section and serves to ensure rigidity.

Figure 12:
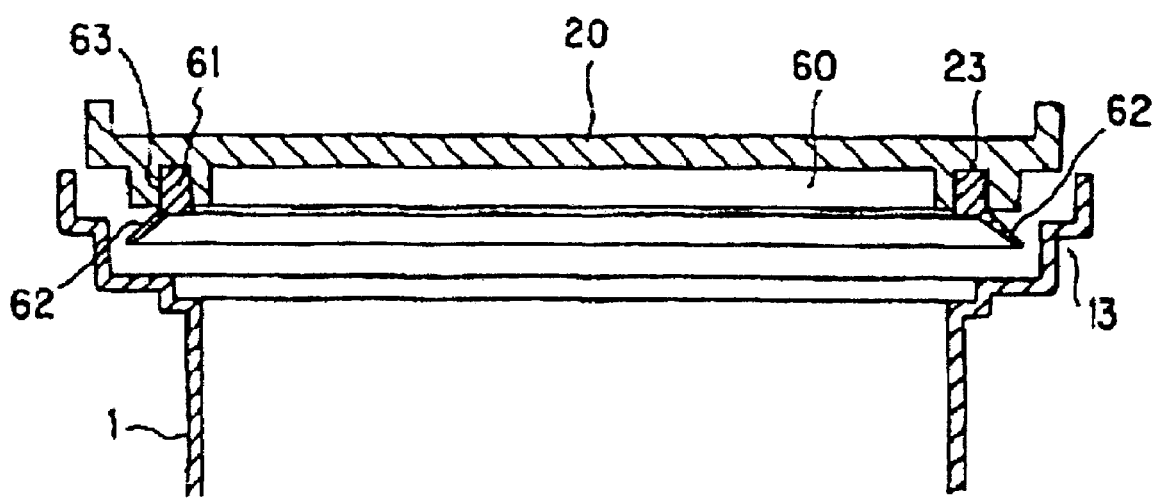
FIG. 12 is a cross-sectional view showing the positional relationship of a container casing, cover and sealing gasket.

As shown in FIG. 2 or FIG. 12, the inner face peripheral section of the fitting plate 21 is formed with an endless retaining groove 23. A sealing gasket 60 to ensure sealing is detachably fitted in this retaining groove 23.

A plurality of water drainage holes employed during washing are formed with prescribed separations in the peripheral wall of the fitting plate 21. Also, at the top and bottom of the peripheral wall, a pair of left and right apertures 24 are formed with a prescribed separation. The positions of formation of the apertures 24 correspond to the positions where the engagement holes 14 of the container casing 1 are formed. A plurality of mounting holes for mounting the cover plate 32 are formed with prescribed separations in the peripheral wall on both the left and right sides of the fitting plate 21.

As shown in FIG. 1, a protruding pedestal 25 for gripping purposes when the cover 20 is opened and closed is provided in the central section of the outer face of the fitting plate 21. This protruding pedestal 25 with a flat outer face defines a pair of left and right channel section installation spaces 26 between itself and the peripheral walls on the left and right sides of the fitting plate 21. The latch mechanisms 70 are set in position in these installation spaces 26. A pair of position locating holes 27 that are employed for positional location of the cover 20 is provided on the left and right of the vertical section of this protruding pedestal 25. The pair of upper and lower position locating holes 27 is arranged on a diagonal line on either side of the central line of the cover 20.

A plurality of mounting holes for mounting the cover plate 32 are provided with prescribed separation at the periphery of the protruding pedestal 25. Mounting holes are provided in the installation spaces 26 and/or their vicinity as required. As shown in FIG. 14, a cylindrical rib 28 and a plurality of cams 31 positioned above and below (left/right direction in FIG. 14) the cylindrical rib 28 are provided in the installation spaces 26.

The cylindrical rib 28 is notched in the vertical direction by slits 30 at angular intervals of for example 90° in order to present a water draining action. The cylindrical rib 28 is thereby divided into a plurality of separate elements. The cams 31 are provided with a pair of left and right cam rails that extend parallel in the vertical direction with a separation therebetween. The outer surfaces of the cam rails are formed with cam surfaces including smooth concave/convex faces. Some of the cams 31 are selectively formed in the vicinity of the mounting holes in the vicinity of the periphery of the fitting plate 21.

The cover plates 32 are formed in a shape substantially corresponding to the installation spaces 26. A plurality of mounting elements are formed in projecting fashion on for example the left and right side walls of the cover plates 32. The cover plates 32 are mounted in the fitting plate 21 by these mounting elements being fitted into the mounting holes of the fitting plate 21. Removal elements for operating purposes are formed in the cover plates 32, or operating through-holes 33 for operating the latch mechanisms 70 are formed in the vicinity of the center of the cover plate 32. The operating through holes 33 present a rectangular shape in front view and an operating key of the cover opening/closing device, not shown, is inserted into these operating through-holes 33.

Cams 34 facing the cams 31 that are provided in the installation spaces 26 are provided, with a separation, on the inside face of the cover plate 32. The cams 34 on the side of the cover plate 32 are provided with a pair of left and right cam rails extending in parallel in the vertical direction. The outer surface of the cam rails is formed with a cam surface including a smooth concave/convex surface. Some of the cams 34 are selectively formed in the vicinity of the peripheral section of the cover plate 32, so as to improve the rigidity of the cover plates 32.

The cover 20 may be formed using for example polycarbonate, fluorine-containing polycarbonate, polybutylene terephthalate, polyether ether ketone, polyether imide, or polyacetal.

As shown in FIG. 2, the front retainer 40 is detachably installed on the fitting plate 21 of the cover 20. The front retainer 40 and a rear retainer, not shown, provided at the internal back face of the container casing 1 elastically supports the front and the rear peripheries of the silicon wafers W, respectively, thereby lifting up the silicon wafers W from the teeth 3 to prevent generation of particles by friction between these silicon wafers W and the teeth 3 during transportation. The front retainer 40 and the rear side inclined faces of the supporting walls 2 may elastically support the front and the rear peripheries of the silicon wafers W, respectively.

As shown in FIG. 6 to FIG. 9, the front retainer 40 comprises a longitudinally elongate supporting frame 41 mounted on the fitting plate 21, a plurality of elastic pieces 44 deformably spanning the space between the left and right side sections of this supporting frame 41, a guide block 47 that fits with the front periphery of a silicon wafer W provided in substantially the center of each elastic piece 44, and a pair of guided blocks 52 that grip the front periphery of a silicon wafer W, being respectively formed with a prescribed separation on both sides of each elastic piece 44. The guide block 47 guides the front periphery of a silicon wafer W in the guided blocks 52.

The supporting frame 41 comprises a pair of first bars 42 positioned on the left and right with a separation therebetween and a pair of second bars 43 respectively spanning the space between the upper and lower ends of this pair of first bars 42. A plurality of elastic pieces 44 extending in the left and right transverse direction between the pair of first bars 42 extending in the vertical direction are arranged in the vertical direction with prescribed separation. A slit 44a of prescribed depth is formed at the sides of the plurality of elastic pieces 44.

Preferably the mounting of the supporting frame 41 onto the fitting plate 21 is performed by means of a plurality of holding claws (not shown) provided on the inside face of the fitting plate 21, in particular in the vicinity of the center of the inside face.

The elastic pieces 44 comprise an intermediate element 45 that is formed bent in substantially corrugated shape and a pair of side elements 46 that are integrally formed by bending between the first bars 42 and the intermediate elements 45. The elastic pieces 44 are bent or curved in the forwards/rearwards direction so as to improve rigidity of the cover 20.

With a view to achieving both stable retaining of the silicon wafers W and ease of operation of the cover opening/closing device, the thickness and width of the elastic pieces 44 and the depth of the slits 44a at the side thereof are adjusted so as to satisfy the relationship expression: $10.8 \times w < y < 34.3 \times w$, where the substrate retaining force per elastic piece 44 is defined as y [N] and the weight per silicon wafer W is defined as w [kg]. The reason for this is that, if the substrate retaining force y is smaller than $10.8 \times w$, when the substrate storage container is transported with the cover 20 directed downwards, the silicon wafers W cannot be retained in stable fashion due to vibration and/or acceleration, so there is a risk of rotation or friction of the silicon wafers W, resulting in contamination.

Contrariwise, if the substrate retaining force y exceeds $34.3 \times w$, notwithstanding that retention of the silicon wafers W is excellent, the silicon wafers W are strongly pressed into contact with the rear face side of the container casing 1, with the risk of damaging the rear retainer of the container casing 1. Also, the restoring force of the elastic pieces 44 becomes large, so the pressing force when the cover 20 is installed on the container casing 1 becomes too large, adversely affecting ease of operation or making use impossible, or making it necessary to provide a separate device of special specification.

It should be noted that the substrate retaining force y per elastic piece 44 is adjusted in the range 1.3 to 4.5 [N] when the full maximum number of silicon wafers W of diameter 300 mm have been stored in the container casing 1. Also, the cover pressing force when the full maximum number of silicon wafers W of diameter 300 mm have been stored in the container casing 1 and the cover 20 has been fitted at the open front face of the container casing 1 is specified to be in the range 30 to 112.5 [N], preferably 40 to 80 [N].

The guide block 47 comprises a rectangular block 48 that is integrally formed with the intermediate element 45 of the elastic piece 44 and a free-fitting guide groove 49 that guides or scoops up the front periphery of a silicon wafer W, and that is constituted by the outer face of this block 48 being formed in recessed manner. This guide block 47 is formed so as to face the rear face direction of the container casing 1 (i.e. the direction of the silicon wafers W). The guide block 47 projects slightly in the rear face direction of the container casing 1 beyond the guided blocks 52 and is positioned substantially on the center line of the silicon wafers W or on the line of extension thereof when the cover 20 is fitted into the container casing 1.

The inside faces 51 of the pair of opposing walls 50 constituting the free-fitting guide groove 49 of the guide block 47 are provided in inclined fashion so as to gradually spread out towards the direction of the rear face of the container casing 1. The pair of inside faces 51 of the opposing walls 50 are provided as planar faces inclined such that their center angle is 45° to 60°, or may be formed as curved faces if required.

The guided blocks 52 comprise a rectangular block 53 integrally formed with the side element 46 of the elastic piece 44, a guide groove 54 that guides the front periphery of the silicon wafers W, being constituted by forming the outer surface of this block 53 in recessed manner, and a substantially rectangular position locating groove 55 that grips the front periphery of an incoming silicon wafer W that is guided thereinto and that is formed by notching the bottom section of this guide groove 54. These guided blocks 52 are formed so as to face the rear face direction of the container casing 1 (i.e. the direction of the silicon wafers W).

Figure 9:
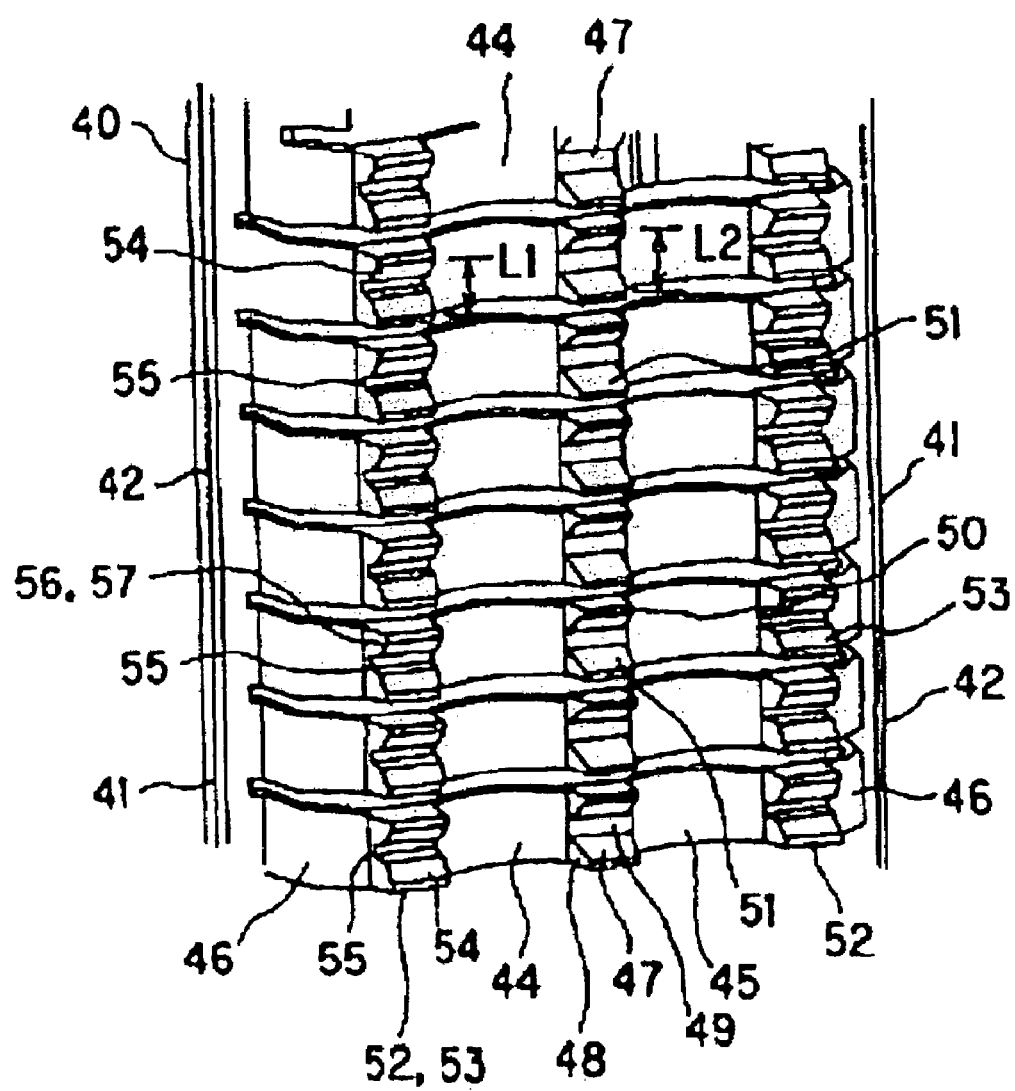
FIG. 9 is a perspective view showing a detail of a front retainer.

The inside faces 57 of the pair of facing walls 56 that constitute the guide grooves 54 of the guided blocks 52 are provided in inclined fashion so as to gradually spread out in the direction of the rear face of the container casing 1. Also, as shown in FIG. 9, the distance L1 of the aperture is set so as to be smaller than the distance L2 of the aperture of the guide block 47.

The inside faces 54 of the pair of opposing walls 56 are provided as planar faces inclined such that their center angle is 45° to 60°. Furthermore, the inside faces of the pair of opposing walls constituting the position locating groove 55 are provided as planar faces inclined such that their center angle is 10° to 40°. The reason why the center angle of the inside faces of the position locating groove 55 is in the range 10° to 40° is that if the center angle is less than 10° fitting with the silicon wafers W becomes tight, giving rise to a risk of contamination of the silicon wafers W. Also, if the center angle exceeds 40°, looseness of the silicon wafers W becomes excessive, with the risk of problems such as the silicon wafers coming out of the grooves during transportation.

Preferably the maximum length L1 in the aperture of the guide groove 54 is greater than the aperture length at the bottom section of the guide groove 49 of the guide block 47.

The front retainer 40 may be formed for example using polycarbonate, fluorine-containing polycarbonate, polybutylene terephthalate, polyether ether ketone, polyether imide or polyacetal, or various types of thermoplastic elastomer such as thermoplastic polyolefin elastomer, or thermoplastic polyester elastomer.

Figure 10:
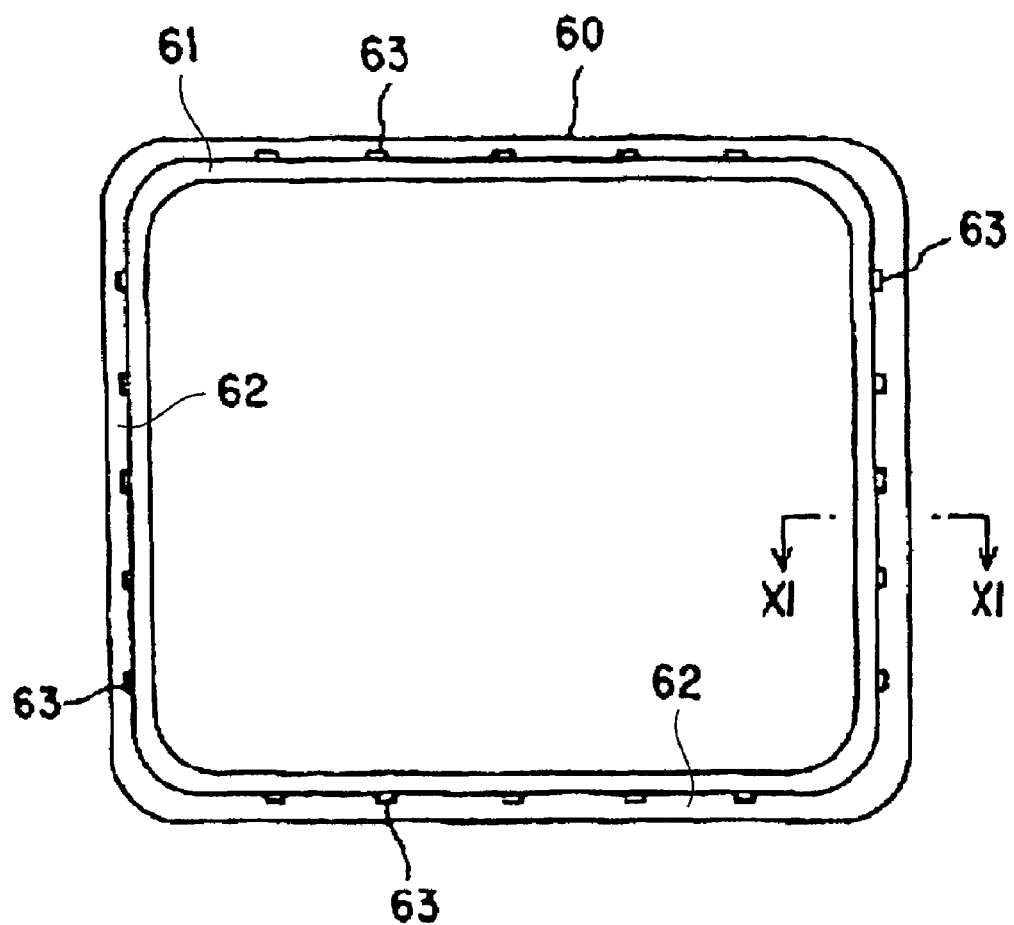
FIG. 10 is a view showing a sealing gasket.
Figure 11A:
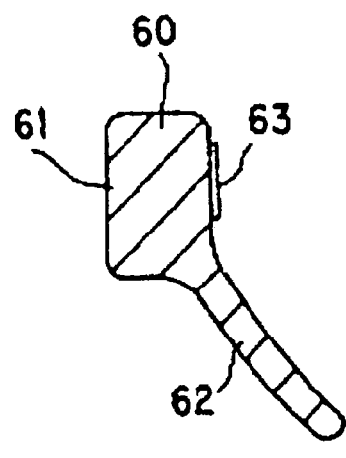
FIG. 11A is a cross-sectional view along the line XI-XI of FIG. 10
Figure 11B:
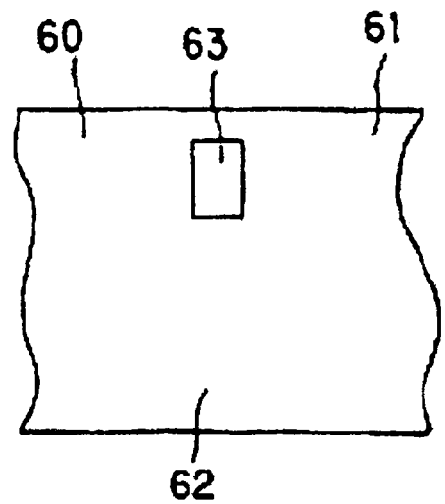
FIG. 11B is a view showing the fitting rib shown in FIG. 11A.

As shown in FIG. 10 to FIG. 12, the sealing gasket 60 may include for example an endless body 61 of substantially rectangular cross section formed in annular shape, bent pieces 62 that are capable of bending and a plurality of fitting ribs 63 that are capable of deformation. The endless bodies 61 are fitted into a retaining groove 23 of the fitting plate 21. The bent pieces 62 extend in the outwards direction of the endless bodies 61 by projecting to the outside in inclined fashion from the corners of the endless bodies 61, and contact the inner circumferential surface of the rim 13. The fitting nibs 63 are formed in projecting fashion arranged in the circumferential direction from the outer surface of the endless bodies 61 and are forcibly fitted into the retaining groove 23 of the fitting plate 21 in a pressurize condition. This sealing gasket 60 is formed with hardness of the order of 60° to 90° (measured in accordance with JIS 6253).

The sealing gasket 60 may be formed in elastically deformable fashion using for example silicone rubber, fluorine rubber, thermoplastic polyester elastomer, thermoplastic polyolefin elastomer, EPDM or NBR. Of these, fluorine rubber is preferable since the amount of organic gaseous constituents that it generates on heating is small and it thus has little effect on the silicon wafers W. The bent piece 62 of the sealing gasket 60 is formed of substantially plate-shaped cross-section and is selectively formed, if required, with a protruding projection, not shown, of substantially spherical shape in cross-section at its tip and is bent to contact the inner circumferential surface of the rim 13.

Such a sealing gasket 60 acts as a one-way seal whereby, if a pressure difference is generated between the inside and outside of the substrate storage container after the container has been hermetically sealed by the cover 20, gas containing dust (containing particles) is prevented from flowing into the interior from outside the substrate storage container and gas is made to flow to the outside from within the substrate storage container.

As shown in FIG. 13 and FIG. 14, a latch mechanism 70 comprises a rotary reel 71 and a pair of latch arms 72. The rotary reel 71 is supported in rotatable fashion on a cylindrical rib 28 of the fitting plate 21. This rotary reel 71 is capable of operation for rotation by means of an operating key from outside. The latch arms 72 are gripped in slidable fashion in the vertical direction between a cam 31 on the side of the fitting plate 21 and a cam 34 on the side of the cover plate 32. The latch arms 72 are operatively connected with the rotary reel 71. The latch arms 72 slide linearly in the vertical direction in response to rotation of the rotary reel 71. Engagement claws 73 are provided that are engaged in engagement holes 14 provided in the rim 13 of the container casing 1 at the tip of the latch arms 72.

The rotary reel 71 is provided in the form of a disk with a hollow cylindrical section formed on its underside. A substantially rectangular operating hole, in front view, into which an operating key may be fitted from outside, is provided in the central section of the outer surface of the rotary reel 71. Also, a pair of arcuate guide grooves whereby rotational movement of the rotary reel 71 is converted into linear movement of the latch arms 72 are formed in the rotary reel 71. The rotary reel 71 constructed in this way is rotated in the clockwise direction or anti-clockwise direction by 90° by insertion of an operating key from outside into the operating hole.

It should be noted that the connection positions and/or dimensions of the cover opening/closing device are prescribed for each size of container by the SEMI standard. For example, the device interface specification for automatic opening/closing of the cover 20 in a processing step container that accommodates in stacked fashion 300 mm silicon wafers W is prescribed so as to be capable of being used with a cover opening/closing device standardized in accordance with E62 of the SEMI standard.

The latch arms 72 are formed in substantially rectangular plate shape corresponding to the width of the pair of camp rails. The latch arms 72 are arranged on the pair of cam rails such that their center lines in the longitude direction intersect with the axis of rotation of the rotary reel 71. The latch arms 72 are provided at their tips with engagement claws 73 of substantially L-shaped cross-section and at their inner ends with pins 74. These pins 74 are directly fitted into a guide groove of the rotary reel 71. Alternatively, the pins 74 could be indirectly fitted into the guide grooves through rotary rollers, in order to prevent generation of dust.

A plurality of pin projections 75 are arranged with a prescribed separation at both the left and right sides of the latch arms 72. These pin projections 75 slide in direct contact with the cam faces of the cam rails. Alternatively, the pin projections 75 could indirectly contact the cam surfaces of the can rails through rotary rollers, in order to prevent generation of dust.

Preferably, the engagement claws 73 provided on the latch arms 72 are provided with a taper in order to reduce the area of contact whereby they contact the engagement holes 14 of the rim 13. In this way, friction can be reduced when the engagement claws 73 are fitted into the engagement holes 14. Also, the latch mechanisms 70 may be formed using for example polycarbonate, fluorine containing polycarbonate, polybutylene terephthalate, polyethylene terephthalate, polyether ether ketone, polyether imide or polyacetal.

In the above, when the rim 13 of the container casing 1 storing a plurality of silicon wafers W in stacked fashion is hermetically sealed and closed by means of the cover 20, the rotary reel 71 of the latch mechanisms 70 is rotated through 90° on pressure fitting of the cover 20 into the rim 13 of the container casing 1 by the cover opening/closing device. When this happens, with the rotation of the rotary reels 71, the latch arms 72 slide linearly while being guided along the cam surface of the cams 31, 34, so that the engagement claws 73 of the latch arms 72 project from the apertures 24 of the fitting plate 21 and are engaged with the engagement holes 14 of the container casing 1. In this way, the container casing 1 is hermetically sealed by the cover 20.

When the cover 20 is fitted, the silicon wafers W may be somewhat separated in the vertical direction or somewhat inclined to the vertical direction, but, if this is the case, the inclined inside faces 51 of the free-fitting guide groove 49 provided in the guide block 47 guide or scoop up the front peripheries of the silicon wafers W into the center of the free-fitting guide groove 49.

Thanks to this guiding action of the free-fitting guide groove 49, the inclined inside faces 57 of the guide groove 54 provided in the guided blocks 52 guide the front peripheries of the silicon wafers W into the position locating grooves 55 defining the normal position, so that the front periphery of the silicon wafer is suitably gripped in the position locating grooves 55. In this way, the front retainer 40 provides three-point support of the front periphery of the silicon wafers W by means of the guide block 47 and the pair of guided blocks 52.

When the cover 20 is removed from the container casing 1 storing a plurality of silicon wafers W in stacked condition, the cover opening/closing mechanism rotates the rotary reels 71 of the latch mechanisms 70 through 90° from the condition described above. When this happens, with the rotation of the rotary reels 71, the latch arms 72 slide linearly while being guided by the cam faces of the cams 31, 34, so that the engagement claws 73 of the latch arms 72 are retracted into the aperture 24 of the fitting plate 21 from the engagement holes 14 of the container casing 1. In this way, the cover 20 can be removed from the container casing 1.

In the above construction, if the substrate retaining force per elastic piece 44 is defined as y [N] and the weight per silicon wafer W is defined as w [kg], adjustment is effected so as to satisfy the relationship: $10.8 \times w < y < 34.3 \times w$ so fully sufficient retaining force of the front retainer 40 can be secured. The risk of damage to the silicon wafers W even when subjected to more than anticipated shock during transportation can thus be excluded to a fully satisfactory degree. Also, when the cover 20 of an FOSB type container is opened or closed, a cover opening/closing device as standardized for the FOUP type can be employed without modification.

Also, since the plurality of teeth 3 are arranged in the vertical direction with a pitch of about 10 mm, which is larger than conventionally, interference of the fork of the robot with the silicon wafers W can be effectively prevented. Also, since a step 9 that contacts a silicon wafer W is provided between the front medium thickness region 5 and the front increased thickness region 6 of the teeth 3, it is possible to effectively suppress positional drift of the silicon wafers W in the left/right direction.

Also, since the contacting area is reduced as far as possible by supporting the silicon wafers W by the front intermediate thickness region 5 and rear intermediate thickness region 7 without contacting the silicon wafers W in the reduced thickness region 10, generation of particles can be largely suppressed.

Also, since the bent piece 62 of the sealing gasket 60 is inclined in the outwards direction and the bent piece 62 thus cannot be deformed in either the inwards or outwards directions, unevenness of sealing performance cannot be generated. Also, since the fitting ribs 63 of the endless bodies 61 are in pressure contact with the retaining groove 23 and so are difficult to remove and, even if for example the cover 20 is subjected to repeated opening/closing operations, there is no possibility of positional drift or excessive deformation of the sealing gasket 60. Also, since the sealing gasket 60 is set in position in the cover 20 rather than the container casing 1, increased complexity of the shape of the rim 13 can be effectively avoided.

Also, since the front periphery of the silicon wafers W is retained and protected by the guided blocks 52, resistance to shock and resistance to deformation of the front retainer 40 can be very considerably improved by a straightforward construction. It is thereby possible to effectively suppress or prevent damage to the silicon wafers W during transportation.

Also, since the free-fitting guide groove 49 of the guide block 47 is arranged so as to be positioned on the line of extension of the center line of the silicon wafers W and these can be formed with a large width thanks to the guide grooves 54, when the cover 20 is mounted on the container casing 1 and the free-fitting guide groove 49 first comes into contact with the silicon wafers W, positional drift or error of the silicon wafers W can be corrected in a stable fashion along the center line. In this way, the silicon wafers W can be reliably guided into the guided blocks 52.

Also, unlike the free-fitting guide groove 49, the guided blocks 52 are arranged so as to form angles in the range 3° to 20°, preferably 5° to 15° between themselves and the center line of the silicon wafers W, so that the silicon wafers W guided by the guide groove 54 and stored in the position locating groove 55 can be retained in stable fashion.

Also, thanks to the presence of the free-fitting guide groove 49, it is possible to reliably guide the silicon wafers W into the position locating groove 55 even when the range of the guide groove 54 is narrow. Also, since it is unnecessary to provide the guide groove 54 in a wide range and the angle of inclination from the horizontal plane can be set so as to provide little resistance, it is possible to design the guided blocks 52 so that the increased thickness section thereof is small so that there is little molding contraction and excellent dimensional stability. Also, since the front periphery of the silicon wafers W is retained with high accuracy by the guided blocks 52, a standardized cover opening/closing device can be employed.

Furthermore, by providing a plurality of elastic pieces 44 spanning the two side sections of the support frame 41 and providing a gripping rib (not shown) in at least one location in the supporting frame 41, improvement in handling characteristics such as ease of mounting/demounting of the front retainer 40 can be expected. Furthermore, since, when the cover 20 is fitted into the container casing 1, the guide block 47 is positioned on the center line of the silicon wafers W, this guide block interferes with the silicon wafers W earlier than the guided blocks 52 and it is thereby possible to achieve more reliable guiding of the silicon wafers W.

It should be noted that although, in the above embodiment, supporting walls 2 were employed, it would also be possible to provide a supporting frame instead of the supporting walls 2 and to arrange a plurality of teeth 3 in this supporting frame in the vertical direction by means of upright ribs. In this case, at the rear of the supporting frame, a substantially U-section or substantially V-section retaining groove may be formed positioned between adjacent teeth 3 and the rear periphery on both sides of the silicon wafers W may be retained by this retaining groove. Also, the front medium thickness region 5 and the rear medium thickness region 7 of the teeth 3 may be the same or different in area.

Also, the teeth 3 may be formed of: a flat plate 4 formed in substantially V shape in plan view so as to run along the peripheral section of the silicon wafers W; a front medium thickness region 5 formed on the front inside where this flat plate 4 is bent; a flat front increased thickness region 6 integrally formed on the front outside of the flat plate 4 and positioned on the outside of the front medium thickness region 5, in other words, nearer to the supporting frame; and a rear medium thickness region 7 formed at the rear of the flat plate 4: a step 9 is formed between the front medium thickness region and front increased thickness region 6, and the silicon wafers W are supported substantially horizontally by the substantially flat front medium thickness region 5 and rear medium thickness region 7.

Also, a plurality of position locating elements may be respectively provided on the bottom plate rather than on the bottom face of the container casing 1. Also, the bottom plate may be increased in size so as to provide opposing walls facing the two side walls of the container casing 1 at both sides thereof and feeding handles for gripping purposes may be mounted on these opposing walls. Also, a wall may be provided positioned at the rear face side of the container casing 1 at the rear of the bottom plate and an identification code or RFID system (radio frequency identification) IC tag (also referred to as a wireless tag) or the like may be stuck, fitted or supported on this wall.

Also, the peripheral section of the front aperture of the container casing 1 may be formed of L-shaped cross section, its tip may be formed of substantially U-shaped cross section, and the internal space provided by the concave section thereof may be employed as an engagement hole 14. Also, a protruding pedestal 25 of substantially rectangular shape in front view may be fixed or detachably provided in the central section of the outer face of the fitting plate 21. Also, locking mechanisms that lock rotation of the rotary reel 71 and constituting part of the latch mechanisms 70 may be arranged on the cover 20.

Also, the rigidity of the front retainer 40 may be increased by arranging a vertical rib, this vertical rib and the plurality of elastic pieces 44 being integrated, in the vertical direction spanning the pair of second bars 43 extending in the left and right direction. In addition, the inside faces 51, 57 of the guide block 47 and guided blocks 52 may be symmetric or asymmetric.

A practical example of a substrate storage container according to this embodiment and a comparative example are described together below.

First of all, the substrate storage container is assumed to be of the type shown in FIG. 1 to FIG. 14, the maximum number of silicon wafers that can be stored by the container casing is assumed to be 25, and the container is assumed to be fully loaded with silicon wafers of specular surface and diameter 300 mm. For the front retainer mounted on the inside face of the cover, as shown in Table 1, six types of samples were prepared, varying the material, width of the elastic pieces and slit depth of the sides of the elastic pieces.

TABLE 1

| DIMENSIONS ETC SAMPLES | MATERIAL OF ELASTIC PIECE | WIDTH OF ELASTIC PIECE (MM) | SLIT DEPTH OF SIDE SECTION OF ELASTIC PIECE (MM) |
|---|---|---|---|
| PRACTICAL EXAMPLE 1 | PBT | 4 | 12 |
| PRACTICAL EXAMPLE 2 | PTEE | 6 | 12 |
| PRACTICAL EXAMPLE 3 | PTEE | 6 | 8 |
| PRACTICAL EXAMPLE 4 | PBT | 8 | 8 |

TABLE 1-continued

| DIMENSIONS ETC SAMPLES | MATERIAL OF ELASTIC PIECE | WIDTH OF ELASTIC PIECE (MM) | SLIT DEPTH OF SIDE SECTION OF ELASTIC PIECE (MM) |
|---|---|---|---|
| COMPARATIVE EXAMPLE 1 | PTEE | 4 | 12 |
| COMPARATIVE EXAMPLE 2 | PBT | 8 | 6 |

PBT: POLYBUTYLENE TEREPHTHALATE
PTEE: POLYETHER ETHER ELASTOMER

The silicon wafers were of thickness 0.77 mm, weight 0.13 kg, so the substrate retaining force per elastic piece was adjusted in the range 1.3 to 4.5 N, preferably 1.5 to 3.0 N. This was because, if the substrate retaining force is less than 1.3 N, there is a risk of contamination of the silicon wafers due to friction and rotation. Also, if the substrate retaining force exceeds 4.5 N, the silicon wafers are strongly pressed against the rear face side of the container casing, so there is a risk of scratches or marks being left in the supporting walls on the rear face side of the teeth, the rear retainer or the silicon wafers.

Also, the cover pressing force when the cover is fitted into the front aperture of this container casing was chosen to be 30 to 112.5 N, preferably 40 to 80 N. This is because, if the cover pressing force is less than 30 N, while the cover can easily be removed, the sealing performance of the cover or the retaining force of the silicon wafers is insufficient, giving rise to a risk of contamination of the silicon wafers.

Also, if the cover pressing force exceeds 112.5 N, the cover pressing force of the cover opening/closing device is exceeded, so mounting of the cover by the cover opening/closing device becomes difficult and there is a risk of scratching the silicon wafers due to excessive retaining force. Furthermore, there is a risk of the restoring force of the front retainer becoming too large, adversely affecting the sealing performance of the substrate storage container.

A silicon wafer retaining force test, vibration test, sealing performance test, drop test and test of cover pressing force were respectively performed on substrate storage containers as above: the results are summarized in Table 2.

(1) Silicon Wafer Retaining Force Test

Figure 15:
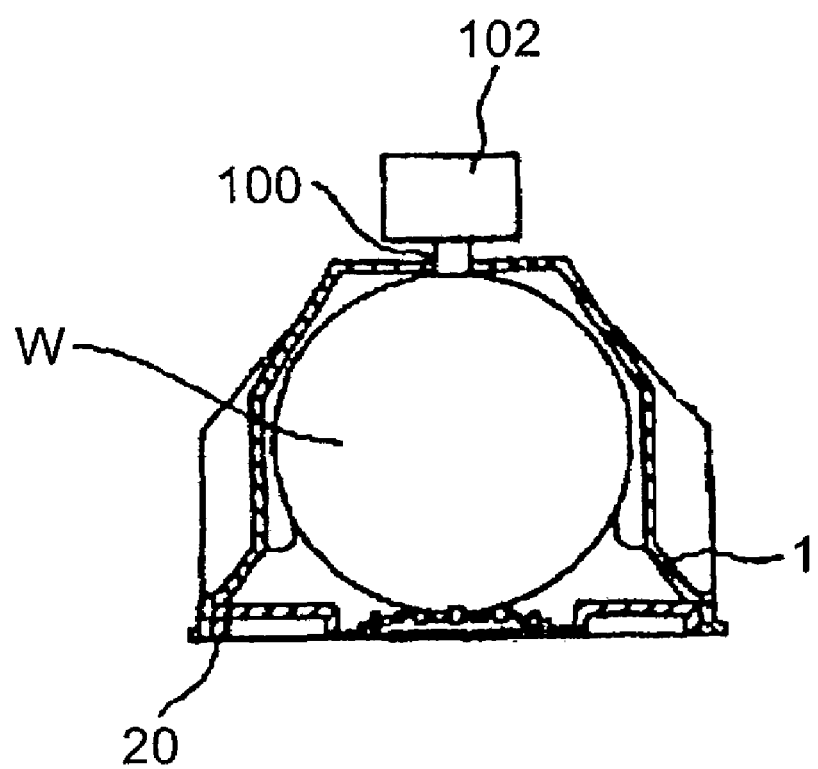
FIG. 15 is a view given in explanation of a test of the silicon wafer retaining force of a substrate storage container according to an embodiment.

First of all, a through-hole 100 in the longitudinal direction was formed in the central section of the rear face wall of the container casing 1 of the substrate storage container and the cover 20 was fitted into the front face aperture of the container casing 1, with 25 silicon wafers W accommodated in this container casing 1. When the cover 20 had thus been fitted onto the container casing 1, the substrate storage container was turned face downwards as shown in FIG. 15 and a measuring instrument called a Tensilon 102 was mounted on its rear face wall and the retaining force of the silicon wafers was measured by applying pressure at the rear of the 25 silicon wafers.

Next, the silicon wafers were pushed downwards one at a time by 1 mm by operating the Tensilon 102 and the retaining force in the lowered position of each silicon wafer was measured and recorded in Table 2. When entering the results in Table 2, the retaining force was taken as the value for a theoretical pushed-in position of 2 mm of the substrate storage container.

(2) Vibration Test

First of all, the cover was fitted onto the front aperture of the container casing with 25 silicon wafers accommodated in the container casing of the substrate storage container. Once the cover had been thus fitted into the container casing, the substrate storage container was accommodated and packaged using packaging material in a cardboard box, this packed cardboard box was set in position on a vibration test machine, and whether the silicon wafers rotated or not was ascertained by performing a vibration test under the following conditions: the results were recorded in Table 2.

The presence or absence of rotation of the silicon wafers was evaluated as being rotation such that the notch of the silicon wafer had moved by at least 3 mm from the position of the center line. "0/25" in Table 2 indicates that none of the 25 silicon wafers had rotated. "9/25 indicates that nine of the 25 silicon wafers had rotated.

Figure 16:
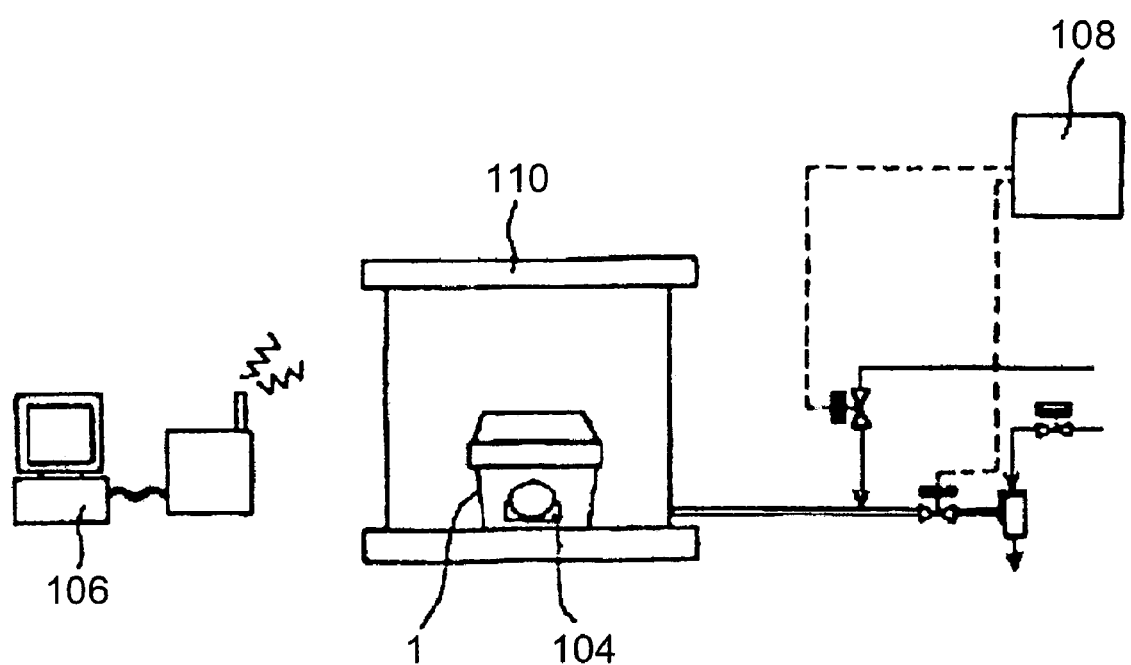
FIG. 16 is a view given in explanation of a test of sealing performance of a substrate storage container according to an embodiment.
Figure 17:
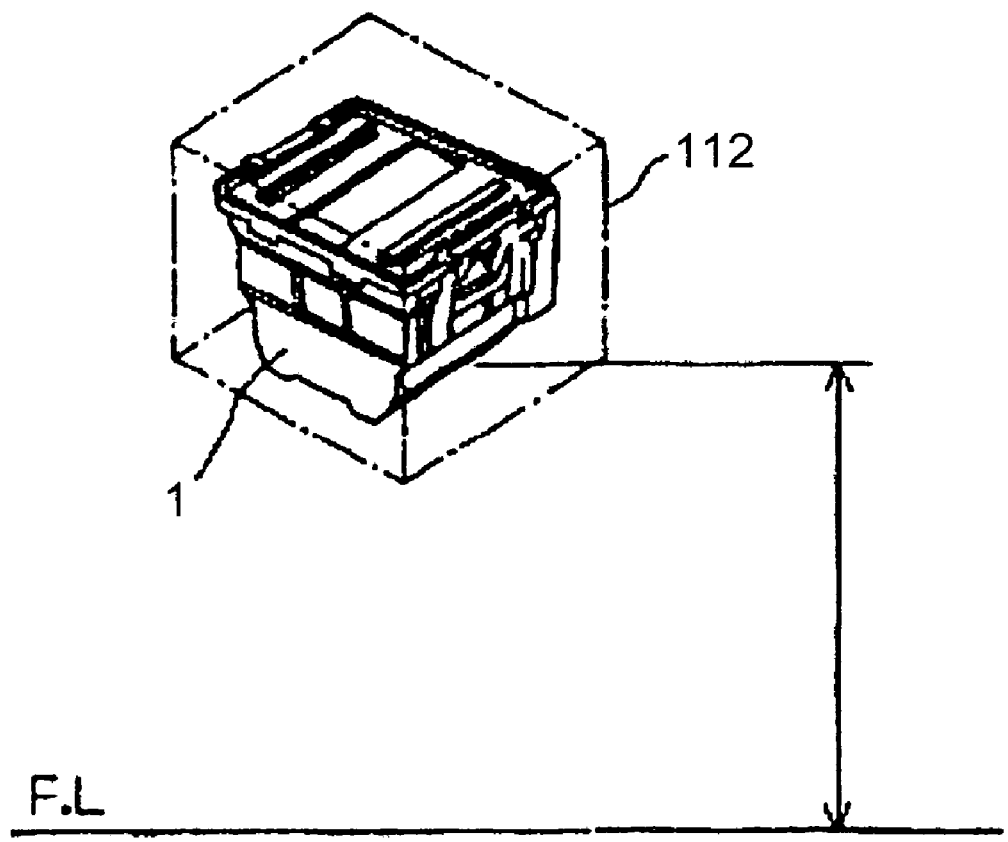
FIG. 17 is a view given in explanation of a drop test of a substrate storage container according to an embodiment.

[Test Conditions]
Amplitude: 1.5 mm
Frequency: scanned for 10 to 55/60 sec
Cycles: 10 cycles (3) Test of Sealing Performance First of all, as shown in FIG. 16, 25 silicon wafers and a wireless pressure sensor 104 were respectively stored in the container casing 1 of the substrate storage container and a hermetically sealed condition was produced by fitting the cover 20 into the front aperture of the container casing 1. When the hermetically sealed condition of the substrate storage container had been produced, this was set in position in a reduced pressure chamber 110 connected with a vacuum pump and the sealing performance of the substrate storage container i.e. the pressure retention time was measured from the change of the value detected by the pressure sensor 104 in response to change of the pressure of this reduced the cover had been fitted into the container casing 1, the substrate storage container was accommodated and packaged using packaging material in a cardboard box 112. This packed cardboard box 112 was then dropped from respective heights of 60 cm, 80 cm and 1 m in accordance with the Drop Test prescribed in JIS (see FIG. 17). The cardboard box 112 was then unsealed and disengagement of the silicon wafers from the grooves of the front container, damage to the silicon wafers and whether or not the silicon wafers had rotated were ascertained visually: the results are summarized in Table 2. In Table 2, "100>" means that the height at which damage occurred was more than 100 cm. Also, "0/25" means that, of the 25 silicon wafers, none had disengaged from the grooves. Also, "4/25" means that, of the 25 silicon wafers, 4 wafers had disengaged from the grooves.

In the drop test, dropping was conducted from heights of 60 cm, 80 cm and 1 m for six faces, three edges and one corner. In evaluation of the presence or absence of rotation of the silicon wafers, rotation was deemed to have occurred if the notch of the silicon wafer had moved by at least 5 mm from the position of the center line.

(5) Test of Pressing in the Cover

Figure 18:
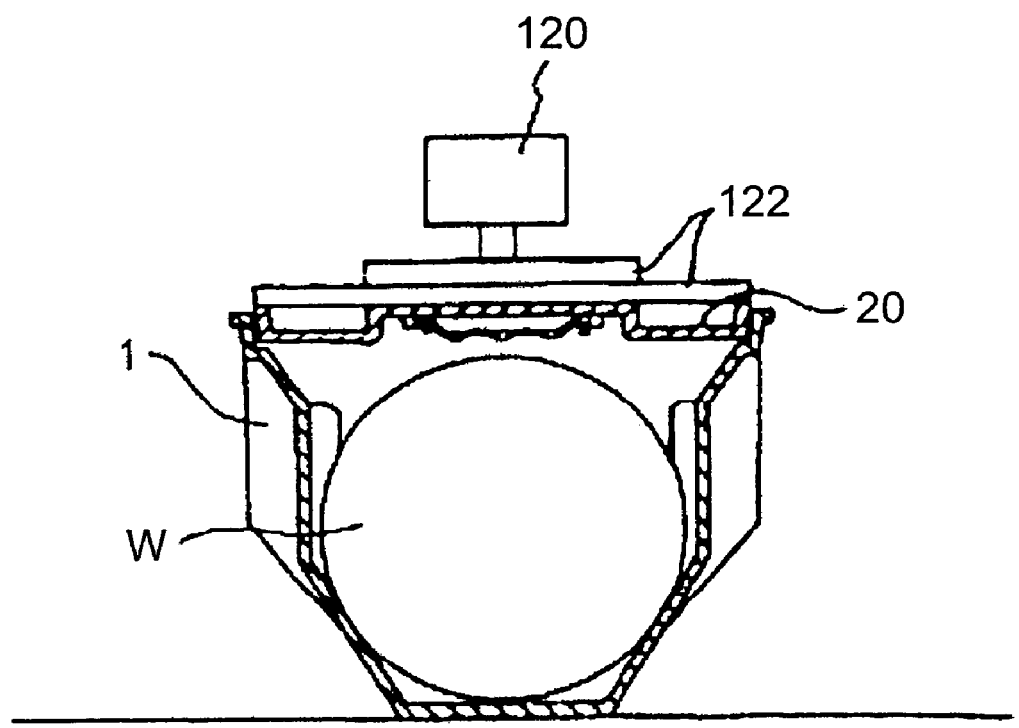
FIG. 18 is a view given in explanation of a cover pressing-on test of a substrate storage container according to an embodiment.

First of all, 25 silicon wafers W were stored in the container casing 1 of the substrate storage container and the container casing 1 was turned to face upwards as shown in FIG. 18. The measuring instrument called a Tensilon 120 was then mounted, by means of a reinforcement plate 122, on the cover 20 of the substrate storage container and the cover 20 placed on the front aperture of the container casing 1 and the cover 20 pressed down to the position at which the latch mechanisms could perform locking; the cover pressing force was then measured using the Tensilon 120: the results are summarized in Table 2.

TABLE 2

| TEST SAMPLES | SILICON WAFER RETAINING FORCE (N/WAFER) | VIBRATION TEST: WHETHER SILICON WAFERS ROTATE OR NOT | SEALING RETENTION TIME (MINUTES) | DROP TEST | | COVER PRESSING FORCE (N) |
| --- | --- | --- | --- | --- | --- | --- |
| | | | | HEIGHT AT WHICH DAMAGE SUSTAINE | DISENGAGEMENT FROM GROOVES | |
| PRACTICAL EXAMPLE 1 | 1.3 | 0/25 | 15> | 100> | 0/25 | 31 |
| PRACTICAL EXAMPLE 2 | 1.8 | 0/25 | 15> | 100> | 0/25 | 42 |
| PRACTICAL EXAMPLE 3 | 3.2 | 0/25 | 15> | 100> | 0/25 | 79 |
| PRACTICAL EXAMPLE 4 | 4.5 | 0/25 | 10 | 100> | 0/25 | 112 |
| COMPARATIVE EXAMPLE 1 | 1.2 | 9/25 | 15> | 80 | 4/25 | 28 |
| COMPARATIVE EXAMPLE 2 | 4.9 | 0/25 | 2 | 100> | 0/25 | 118 | pressure chamber 110 (from −10 kPa to repressurization): the measurement results are summarized in Table 2. In Table 2, "15>" means that the sealing retention time was more than 15 minutes. The detection signal from the pressure sensor 104 was detected using a receiver 106. Control of the device as a whole was performed using a controller 108.

(4) Drop Test

First of all, 25 silicon wafers were stored in the container casing 1 of the substrate storage container and the cover was fitted into the front aperture of the container casing 1. After From the above description of the present invention it can be seen that the present invention can be modified in various ways. Such modifications cannot be regarded as departing from the concept and scope of the present invention and all improvements that are self-evident to persons skilled in the art are included in the scope of the following claims.

What is claimed is:

1. A substrate storage container comprising:
a container casing having an aperture through which a plurality of substrates are placed in or taken out;

a cover adapted to fit into said aperture of said container casing;

a sealing gasket capable of elastic deformation provided between said container casing and said cover; and a retainer, mounted on said cover, capable of retaining the periphery of each of the substrates;

said retainer having:

a supporting body mounted on the inside face of said cover, wherein the supporting body comprises a pair of first bars positioned on opposing sides with a separation therebetween and a pair of second bars respectively spanning a space between upper and lower end portions of said first bars;

a plurality of elastic pieces provided with a separation therebetween in elastically deformable fashion on said supporting body so as to extend between said first bars;

a slit formed at each side of each of said plurality of elastic pieces; and a block provided on each of said elastic pieces, said block retaining the periphery of one of the substrates;

wherein $$10.8 \times w < y < 34.3 \times w$$

when a substrate retaining force of each of said elastic pieces is y in Newtons (N) and a weight per said substrate is w in kilograms (kg).

2. The substrate storage container according to claim 1, wherein the substrates are silicon wafers of diameter 300 mm;

said container casing comprises a top wall, a bottom wall, a pair of side walls, and a rear face wall; and said substrate retaining force of each of said elastic pieces when the maximum number of the silicon wafers is stored in said container casing is in a range of 1.3 to 4.5 N.

3. The substrate storage container according to claim 1, wherein the substrates are silicon wafers of diameter 300 mm;

said container casing comprises a top wall, a bottom wall, a pair of side walls, and a rear face wall; and a pressing force of said cover when the maximum number of the silicon wafers are stored in said container casing and said aperture of said container casing is closed by said cover is in a range of 30 to 112.5 N.

4. The substrate storage container according to claim 3, wherein said pressing force of said cover is in a range of 40 to 80 N.

5. The substrate storage container according to claim 1, wherein each of said plurality of elastic pieces comprises:

an intermediate element; and a pair of side elements formed between said first bars and said intermediate element;

wherein said block comprises:

a guided block provided on each of said side elements and comprising a guide groove for guiding one of the substrates and a position locating groove that positionally locates the one of the substrates provided at the bottom of said guide groove; and a guide block provided on said intermediate element and comprising a guide groove for guiding the one of the substrates.

6. The substrate storage container according to claim 5, wherein said guide block projects further towards said container casing than said guided blocks.

7. The substrate storage container according to claim 5, wherein a maximum width of said guide groove of said guide block is larger than a maximum width of said guide groove of said guided block.

8. The substrate storage container according to claim 5, wherein a center angle made by the pair of opposite inside faces constituting said guide groove of said guide block is 45° to 60°.

9. The substrate storage container according to claim 5, wherein a center angle made by the pair of opposite inside faces constituting said guide groove of said guide block is 45° to 60° and a center angle made by the pair of opposite inside faces constituting said position locating groove is 10° to 40°.

10. A substrate storage container comprising:

a container casing having an aperture through which a plurality of substrates are placed in or taken out;

a cover adapted to fit into said aperture of said container casing;

a sealing gasket capable of elastic deformation provided between said container casing and said cover; and a retainer, mounted on said cover, capable of retaining the periphery of each of the substrates;

wherein said container casing comprises a top wall, a bottom wall, a pair of side walls, and a rear face wall, and a supporting wall is provided on the inside of each of said side walls, and a plurality of teeth that support the substrates are provided arranged in a row in the vertical direction on the inside face of each of said supporting walls; and each of said teeth comprises:

a flat plate running along the lateral periphery of one of the substrates;

a front medium thickness region formed on the inside at the front of said flat plate;

a front increased thickness region of thickness greater than that of said front medium thickness region, formed at the front outside of said flat plate and positioned on the outside of said front medium thickness region;

a rear medium thickness region formed at the rear of said flat plate; and a step provided between said front medium thickness region and said front increased thickness region; and wherein each of said teeth can support one of the substrates substantially horizontally in said front medium thickness region and said rear medium thickness region.

11. The substrate storage container according to claim 10, wherein said sealing gasket comprises:

an endless body that fits into a recess of said cover periphery;

a bent piece projecting in an obliquely outwards direction from said endless body and capable of bending contacting said aperture of said container casing; and a projection that is formed on said endless body and that contacts said recess of said cover periphery.

12. The substrate storage container according to claim 10, wherein each of said teeth comprises a reduced thickness region of thickness smaller than that of said front medium thickness region and said rear medium thickness region, provided on said flat plate between said front medium thickness region and said rear medium thickness region.

13. The substrate storage container according to claim 10, wherein said retainer comprises:

a support body mounted on the inside face of said cover,
a plurality of elastic pieces provided in elastically deformable fashion on said support body, and
a block provided on each of said elastic pieces, said block retaining the periphery of one of the substrates;
wherein $$10.8 \times w < y < 34.3 \times w$$

when a substrate retaining force of each of said elastic pieces is y in Newtons (N) and a weight per said substrate is w in kilograms (kg).

14. A substrate storage container comprising:
a container casing having an aperture through which a plurality of substrates are placed in or taken out;
a cover adapted to fit into said aperture of said container casing;
a sealing gasket capable of elastic deformation provided between said container casing and said cover; and
a retainer, mounted on said cover, capable of retaining the periphery of each of the substrates;
said cover having:
   a fitting plate including a protruding pedestal provided in the central section and a pair of installation spaces provided on both sides of said protruding pedestal;
   a latch mechanism provided in each of said installation spaces; and
   a cover plate capable of detachably covering said latch mechanism;
said retainer having:
   a supporting body mounted on the inside face of said cover, wherein the supporting body comprises a pair of first bars positioned on opposing sides with a separation therebetween and a pair of second bars respectively spanning a space between the upper and lower end portions of said first bars;
   a plurality of elastic pieces provided with a separation therebetween in elastically deformable fashion on said supporting body so as to extend between said first bars;
   a slit formed at each side of each of said plurality of elastic pieces; and
   a block provided on each of said elastic pieces, said block retaining the periphery of one of the substrates;
wherein $$10.8 \times w < y < 34.3 \times w$$

when a substrate retaining force of each of said elastic pieces is y in Newtons (N) and a weight per said substrate is w in kilograms (kg).

* * * * *